US012672327B2

(12) United States Patent
Howder et al.

(10) Patent No.: US 12,672,327 B2
(45) Date of Patent: Jun. 30, 2026

(54) ELECTRONIC DEVICES COMPRISING PILLARS EXTENDING THROUGH A SEMICONDUCTOR MATERIAL AND ADJACENT TO A SOURCE IMPLANT REGION, AND RELATED ELECTRONIC SYSTEMS AND METHODS

(71) Applicant: Micron Technology, Inc., Boise, ID (US)

(72) Inventors: Collin Howder, Boise, ID (US); Alyssa N. Scarbrough, Boise, ID (US)

(73) Assignee: Micron Technology, Inc., Boise, ID (US)

(*) Notice: Subject to any disclaimer, the term of this patent is extended or adjusted under 35 U.S.C. 154(b) by 585 days.

(21) Appl. No.: 17/813,795

(22) Filed: Jul. 20, 2022

(65) Prior Publication Data

US 2024/0030285 A1 Jan. 25, 2024

(51) Int. Cl.
*H10B 43/35* (2023.01)
*H10B 43/10* (2023.01)
(Continued)

(52) U.S. Cl.
CPC ........... *H10D 62/151* (2025.01); *H10B 43/10* (2023.02); *H10B 43/35* (2023.02); *H10D 64/252* (2025.01);
(Continued)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10;

H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27;
(Continued)

(56) References Cited

U.S. PATENT DOCUMENTS 9,741,737 B1    8/2017   Huang et al.
11,737,273 B2   8/2023   Nam et al.
(Continued)

OTHER PUBLICATIONS

Hopkins et al., Integrated Assemblies, and Methods of Forming Integrated Assemblies, filed Dec. 18, 2020, U.S. Appl. No. 17/126,777, 66 pages.
(Continued)

*Primary Examiner* — William B Partridge
*Assistant Examiner* — Gustavo G Ramallo
(74) *Attorney, Agent, or Firm* — TraskBritt

(57) ABSTRACT

Electronic devices comprising a source stack comprising one or more conductive materials, a source implant region within a top portion of the source stack, a source contact adjacent to the source stack, sidewalls of the source contact vertically adjacent to the source implant region, a doped semiconductive material adjacent to a source contact, tiers of alternating conductive materials and dielectric materials adjacent to the doped semiconductive material, and pillars extending through the tiers, the doped semiconductive material, and the source contact and into the source stack. Additional electronic devices are also disclosed, as are related methods and electronic systems.

24 Claims, 37 Drawing Sheets

(51) Int. Cl.

| | |
|---|---|
| *H10D 62/13* | (2025.01) |
| *H10D 64/23* | (2025.01) |
| *G11C 16/04* | (2006.01) |
| *H10B 43/27* | (2023.01) |
| *H10D 30/01* | (2025.01) |
| *H10D 30/69* | (2025.01) |
| *H10D 64/01* | (2025.01) |

(52) U.S. Cl.
CPC .......... *G11C 16/0483* (2013.01); *H10B 43/27* (2023.02); *H10D 30/0413* (2025.01); *H10D 30/693* (2025.01); *H10D 64/037* (2025.01)

(58) Field of Classification Search
CPC ........ H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | |
|---|---|---|---|---|
| 11,839,074 | B2 | 12/2023 | Heo | |
| 2005/0082601 | A1* | 4/2005 | Chu | H10B 69/00 |
| | | | | 257/E27.103 |
| 2017/0162594 | A1 | 6/2017 | Ahn | |
| 2017/0256551 | A1* | 9/2017 | Lee | H10B 41/40 |
| 2017/0338241 | A1 | 11/2017 | Lee | |
| 2018/0122906 | A1* | 5/2018 | Yu | H10B 41/27 |
| 2018/0261671 | A1* | 9/2018 | Matsumoto | H10B 41/41 |
| 2019/0244970 | A1 | 8/2019 | Jung et al. | |
| 2019/0273088 | A1 | 9/2019 | Cui et al. | |
| 2019/0333931 | A1* | 10/2019 | Jung | H01L 21/28525 |
| 2020/0388634 | A1* | 12/2020 | Jung | H10B 41/27 |
| 2021/0036001 | A1* | 2/2021 | Kim | H10D 1/716 |
| 2021/0143167 | A1 | 5/2021 | Howder et al. | |
| 2021/0257387 | A1 | 8/2021 | Huang et al. | |
| 2021/0358929 | A1 | 11/2021 | Hopkins et al. | |
| 2021/0358938 | A1 | 11/2021 | Hopkins | |
| 2021/0358939 | A1 | 11/2021 | Hopkins et al. | |
| 2021/0375903 | A1 | 12/2021 | Hopkins | |
| 2021/0376083 | A1 | 12/2021 | Greenlee et al. | |
| 2021/0384208 | A1 | 12/2021 | Hopkins et al. | |
| 2021/0384216 | A1 | 12/2021 | Greenlee et al. | |
| 2022/0068965 | A1 | 3/2022 | Chandolu et al. | |
| 2022/0149067 | A1 | 5/2022 | Hopkins et al. | |

OTHER PUBLICATIONS

Hopkins et al., Methods of Forming Microelectronic Devices, and Related Microelectronic Devices, and Electronic Systems, filed Sep. 4, 2020, U.S. Appl. No. 17/012,741, 56 pages.

Hopkins et al., Microelectronic Devices Including Cap Structures, and Related Electronic Systems and Methods, filed Dec. 27, 2021, U.S. Appl. No. 63/266,027, 71 pages.

Howder et al., Microelectronic Devices Including Filled Slits and Memory Cell Pillars, and Related Memory Devices, Electronic Systems, and Methods, filed Apr. 16, 2021, U.S. Appl. No. 17/233,158, 46 pages.

Lindemann et al., Electronic Devices Comprising a Dielectric Material, and Related Systems and Methods, filed Jan. 26, 2021, U.S. Appl. No. 17/158,918, 55 pages.

Liu et al., Microelectronic Devices With Vertically Recessed Channel Structures and Discrete, Spaced Inter-Slit Structures, and Related Methods and Systems, filed Jan. 26, 2021, U.S. Appl. No. 17/158,888, 92 pages.

* cited by examiner

ELECTRONIC DEVICES COMPRISING PILLARS EXTENDING THROUGH A SEMICONDUCTOR MATERIAL AND ADJACENT TO A SOURCE IMPLANT REGION, AND RELATED ELECTRONIC SYSTEMS AND METHODS

RELATED APPLICATIONS

The subject matter of this application is related to the subject matter of U.S. patent application Ser. No. 17/813,818, titled "ELECTRONIC DEVICES COMPRISING AN OXIDE FILL REGION, AND RELATED ELECTRONIC SYSTEMS AND METHODS," and U.S. patent application Ser. No. 17/813,847, titled "ELECTRONIC DEVICES INCLUDING AN IMPLANT STRUCTURE, AND RELATED SYSTEMS AND METHODS," each of which was filed on Jul. 20, 2022, the same date as this application.

TECHNICAL FIELD

Embodiments of the disclosure relate to the field of electronic device design and fabrication. More particularly, the disclosure relates to electronic devices having a source implant region in a source stack, and to related electronic systems and methods for forming the electronic devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a three-dimensional (3D) NAND memory device, not only are the memory cells arranged in rows and columns in a horizontal array, but tiers of the horizontal arrays are stacked over one another (e.g., as vertical strings of memory cells) to provide a 3D array of the memory cells. The stack of tiers vertically alternate conductive materials with dielectric materials, with the conductive materials functioning as access lines (e.g., word lines) and gate structures (e.g., control gates) for the memory cells. Pillars comprising channels and tunneling structures extend along and form portions of the memory cells of individual vertical strings of memory cells. A drain end of a string is adjacent one of the top or bottom of the pillar, while a source end of the string is adjacent the other of the top or bottom of the pillar. The drain end is operably connected to a bit line, and the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

In conventional 3D NAND memory devices, the pillars including the channels are formed through multiple polysilicon materials, and contact between the channels and other electrically conductive components of the memory devices is achieved by a laterally-oriented, doped polysilicon material. However, etching the multiple polysilicon materials may cause processing challenges, such as over-etching, since multiple polysilicon materials are present. The over-etching may, for example, lead to corrosion of conductive materials of the source stack.

DETAILED DESCRIPTION

Figure 1:
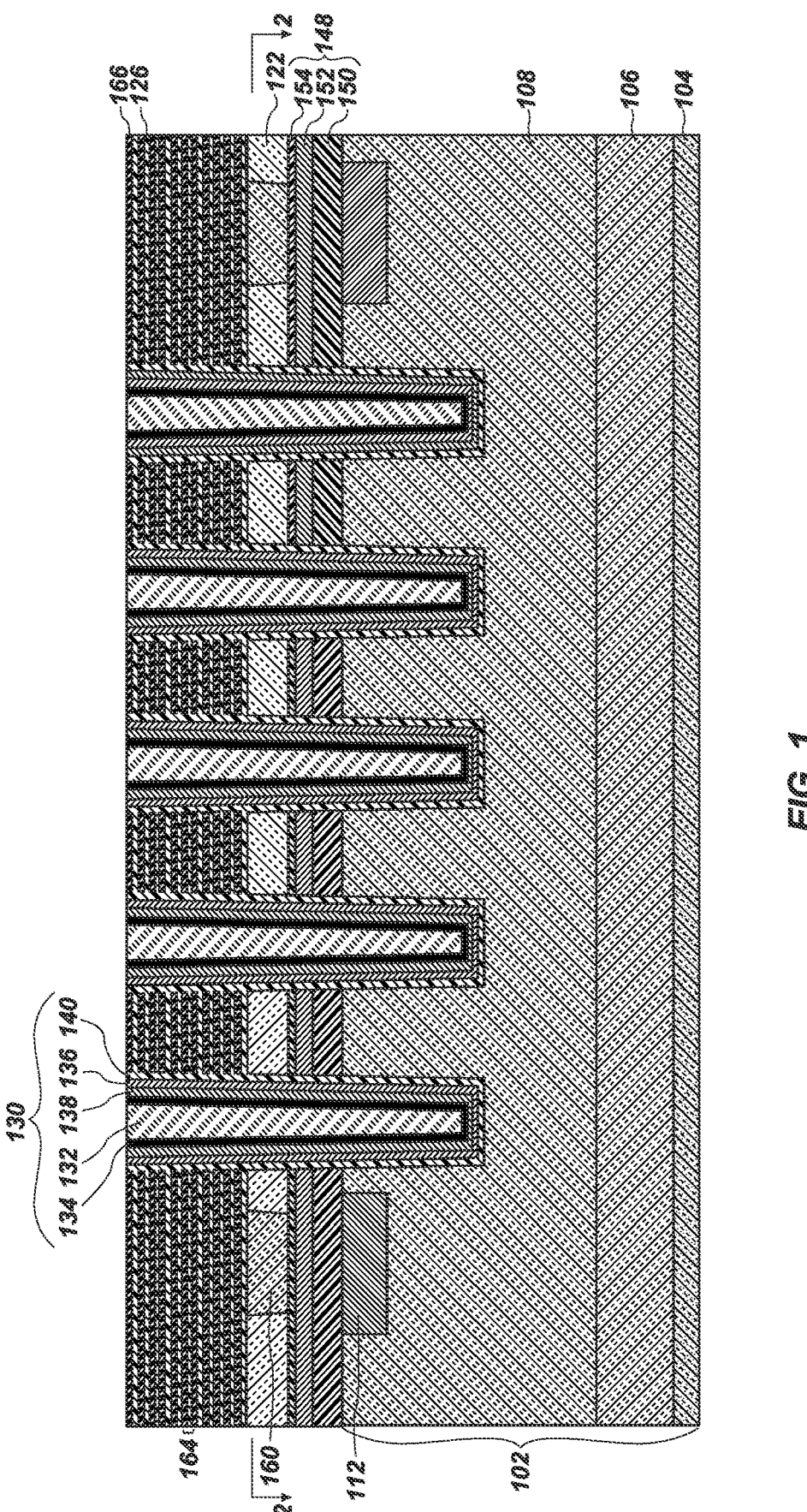
FIGS. 1-15 are cross-sectional, elevational, schematic illustrations during various processing acts to fabricate an electronic device in accordance with embodiments of the disclosure.

Electronic devices (e.g., apparatus, microelectronic devices) and systems (e.g., electronic systems) according to embodiments of the disclosure include a source implant region below a slit that is used to form a lateral contact (e.g., a source contact) to a channel of pillars of the electronic devices. The source implant region provides additional process margin for etching materials of the electronic device and into a source contact region while protecting a source stack below the source contact region. By including the source implant region in a source stack of the electronic device, etching into and through the source contact is controllable. The source implant region protects underlying conductive materials of the source stack, and improves sidewall etching into the source contact region. By appropriately selecting a material of the source implant region, polysilicon materials of the electronic device may be selectively removed without exposing portions of the source stack beneath the source implant region to the removal condition. By protecting the source stack, corrosion of conductive materials of the source stack is reduced or eliminated.

Fabrication of the electronic device includes forming and removing multiple sacrificial structures during the formation of the source contact. A source contact sacrificial structure is used to form the source contact in a desired location and a slit is formed through the source contact sacrificial structure to expose the source implant region. A material selected for the source implant region may be substantially similar to the material of an upper surface of the surface stack, with implantation to provide etch selectivity. A dimension (e.g., a width) of the source implant region in a lateral direction is equal to or wider than the width of a lower portion of the slit.

Therefore, portions of a source contact material may be laterally etched without etching portions of the source stack underlying the source implant region. In contrast to conventional electronic devices, the electronic devices according to embodiments of the disclosure include the source implant region in an upper portion of the source stack and below a fill material subsequently formed in the slit.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), epitaxial growth, or ion implanting (e.g., plasma doping ion implantation). Alternatively, the materials may be grown in situ. Depending on the specific material to be formed, the technique for depositing or growing the material may be selected by a person of ordinary skill in the art unless the context indicates otherwise. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/of" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, the term "conductive material" means and includes an electrically conductive material. The conductive material may include, but is not limited to, one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride (WNy), nickel (Ni), tantalum (Ta), tantalum nitride (TaNy), tantalum silicide (TaSix), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon, where x, y, or z are integers or non-integers.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operably connected with each other, such as electrically connected through a direct ohmic connection or through an indirect connection (e.g., via another structure).

As used herein, the term "dielectric material" means and includes an electrically insulative material. The dielectric material may include, but is not limited to, one or more of an insulative oxide material, an insulative nitride material, an insulative oxynitride material, an insulative carboxynitride material, and/or air. A dielectric oxide material may be an oxide material, a metal oxide material, or a combination thereof. The dielectric oxide material may include, but is not limited to, a silicon oxide ($SiO_x$, silicon dioxide ($SiO_2$)), phosphosilicate glass (PSG), borosilicate glass (BSG), borophosphosilicate glass (BPSG), fluorosilicate glass (FSG), aluminum oxide ($AlO_x$), barium oxide, gadolinium oxide ($GdO_x$), hafnium oxide ($HfO_x$), magnesium oxide ($MgO_x$), molybdenum oxide, niobium oxide ($NbO_x$), strontium oxide, tantalum oxide ($TaO_x$), titanium oxide ($TiO_x$), yttrium oxide, zirconium oxide ($ZrO_x$), hafnium silicate, a dielectric oxynitride material (e.g., $SiO_xN_y$), a dielectric carbon nitride material (SiCN), a dielectric carboxynitride material (e.g., $SiO_xC_zN_y$), a combination thereof, or a combination of one or more of the listed materials with silicon oxide, where values of "x," "y," and "z" may be integers or may be non-integers. A dielectric nitride material may include, but is not limited to, silicon nitride. A dielectric oxynitride material may include, but is not limited to, a silicon oxynitride ($SiO_xN_y$). A dielectric carboxynitride material may include, but is not limited to, a silicon carboxynitride ($SiO_xC_zN_y$). The dielectric material may be a stoichiometric compound or a non-stoichiometric compound.

As used herein, the term "electronic device" includes, without limitation, a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "high-k dielectric material" means and includes a dielectric oxide material having a dielectric constant greater than the dielectric constant of silicon oxide ($SiO_x$), such as silicon dioxide ($SiO_2$). The dielectric constant of silicon dioxide is from about 3.7 to about 3.9. The high-k dielectric material may include, but is not limited to, a high-k oxide material, a high-k metal oxide material, or a combination thereof. By way of example only, the high-k dielectric material may be aluminum oxide, gadolinium oxide, hafnium oxide, niobium oxide, tantalum oxide, titanium oxide, zirconium oxide, hafnium silicate, a combination thereof, or a combination of one or more of the listed high-k dielectric materials with silicon oxide. The term "high-k dielectric material" is a relative term and is distinguished from the term "dielectric material" by a relative value of its dielectric constant. Materials listed above as examples of a "dielectric material" may overlap with some of the materials listed above as examples of a "high-k dielectric material" since the terms are relative.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the terms "opening" and "slit" mean and include a volume extending through at least one structure or at least one material, leaving a void (e.g., gap) in the at least one structure or at least one material, or a volume extending between structures or materials, leaving a gap between the structures or materials. Unless otherwise described, the opening and/or slit is not necessarily empty of material. That is, an opening and/or slit is not necessarily void space. An opening and/or slit formed in or between structures or materials may comprise structure(s) or material(s) other than that in or between which the opening and/or slit is formed. And, structure(s) or material(s) "exposed" within an opening and/or slit is (are) not necessarily in contact with an atmosphere or non-solid environment. Structure(s) or material(s) exposed within an opening and/or slit may be adjacent or in contact with other structure(s) or material(s) that is (are) disposed within the opening and/or slit.

As used herein, the term "sacrificial," when used in reference to a material or a structure, means and includes a material or structure that is formed during a fabrication process but at least a portion of which is removed (e.g., substantially removed) prior to completion of the fabrication process. The sacrificial material or sacrificial structure may be present in some portions of the electronic device and absent in other portions of the electronic device.

As used herein, the terms "selectively removable" or "selectively etchable" mean and include a material that exhibits a greater etch rate responsive to exposure to a given etch chemistry and/or process conditions (collectively referred to as etch conditions) relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and process conditions for selectively removing (e.g., selectively etching) a desired material may be selected by a person of ordinary skill in the art.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials or components, such as those within memory cells, are formed. The substrate may be an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Furthermore, when reference is made to a "substrate" or "base material" in the following description, previous process acts may have been conducted to form materials or structures in or on the substrate or base material.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Figure 2:
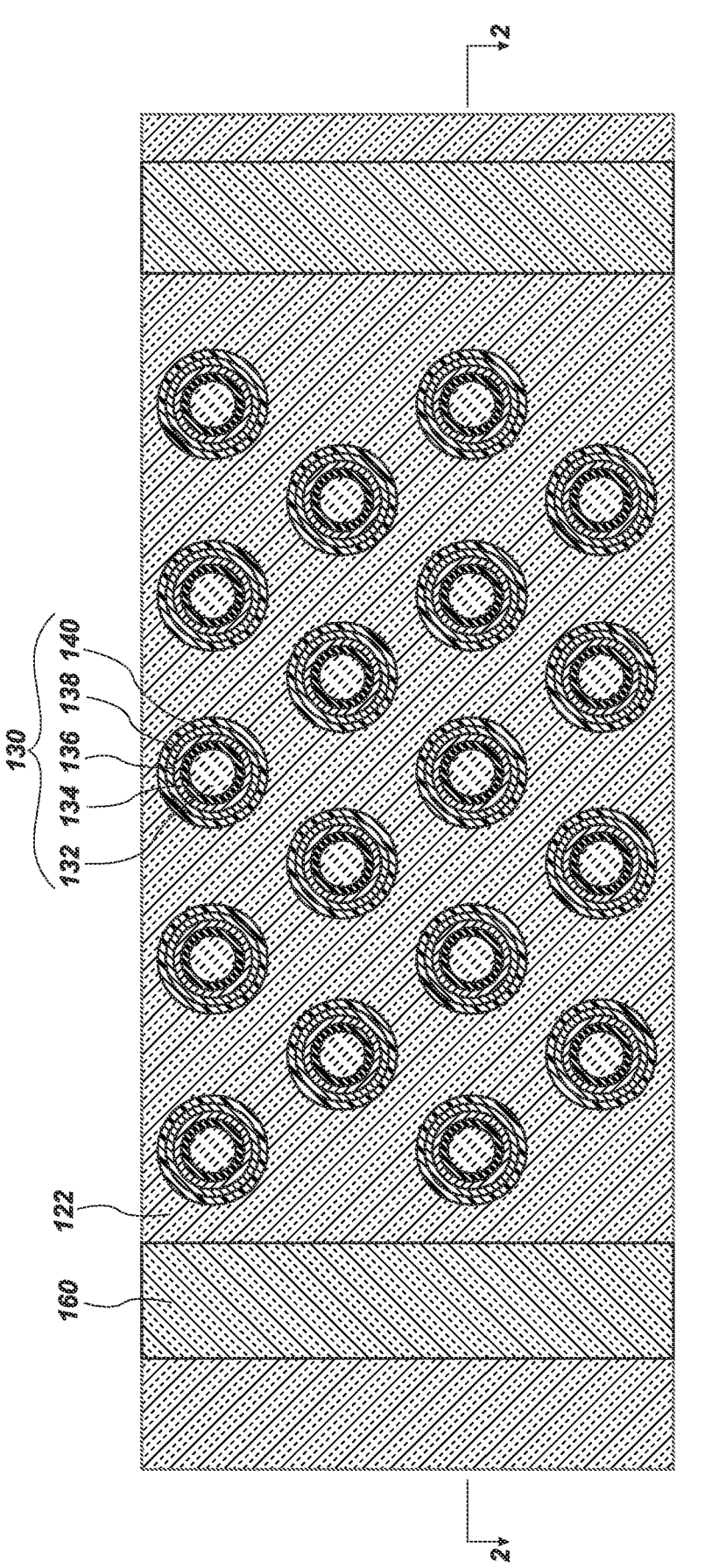

A method of forming an electronic device 100 (FIGS. 16 and 17) according to embodiments of the disclosure is shown in FIGS. 1 through 17. FIG. 1 is a cross-sectional schematic illustration taken through the line 1-1 in FIG. 2, and FIG. 2 is a cross-sectional schematic illustration taken through the line 2-2 in FIG. 1. As shown in FIG. 1, a source stack 102 is formed adjacent to a base material (not shown) and includes one or more conductive materials, with a conductive liner material 104 formed adjacent to the base material, a source material 106 formed adjacent to the conductive liner material 104, and a first doped semiconductive material 108 formed adjacent to the source material 106. In some embodiments, the conductive liner material 104 is formed of and includes titanium nitride, the source material 106 is formed of and includes tungsten silicide (WSi$_x$), and the first doped semiconductive material 108 is formed of and includes a doped polysilicon material. However, the conductive liner material 104, the source material 106, and the first doped semiconductive material 108 may be formed of and include other conductive materials. Each of the conductive liner material 104, source material 106, and first doped semiconductive material 108 may be formed by conventional techniques and to a desired thickness. By way of example only, the conductive liner material 104 may be formed to a thickness of from about 200 Å to about 400 Å, the source material 106 may be formed to a thickness of from about 800 Å to about 1000 Å, and the first doped semiconductive material 108 may be formed to a thickness of from about 2000 Å to about 4000 Å.

A source implant region 112 is present within the source stack 102, such as within an upper portion of the first doped semiconductive material 108. To form the source implant region 112, the first doped semiconductive material 108 may be patterned using a patterned hardmask (not shown) formed adjacent to the upper portion of the first doped semiconductive material 108. The patterned hardmask may be used to form the source implant region 112 at a desired location and at desired dimensions. The source implant region 112 may exhibit an etch rate that is substantially different than (e.g., substantially less than) the etch rate of the first doped semiconductive material 108 and exposed polysilicon materials in the electronic device 100 when exposed to the same etch conditions. The source implant region 112 may, for example, be resistant to a tetramethylammonium hydroxide (TMAH)-based chemistry or other etch chemistry formulated to selectively remove polysilicon. By way of non-limiting example, the source implant region 112 may be formed by implanting a dopant into the first doped semiconductive material 108. The dopant may provide etch selectivity to the source implant region 112 relative to the first doped semiconductive material 108 and other materials exposed to the same etch conditions. By way of example only, the first doped semiconductive material 108 may be implanted with boron, carbon, oxygen, gallium, or a combination thereof to form the source implant region 112. The implant conditions and the dopant concentration may be tailored to achieve the desired etch selectivity of the first doped semiconductive material 108 and other exposed materials relative to the source implant region 112.

The dopant implant conditions and the patterned hardmask are used to control the distribution of the dopant in the first doped semiconductive material 108, forming the source implant region 112. The dopant may be implanted to a desired depth into the first doped semiconductive material 108, such as to a depth of from about 1 nm to about 10 nm, such as about 5 nm. The lateral dimension (e.g., the width) of the source implant region 112 may range from about 150 nm to about 300 nm.

A source contact sacrificial structure 148 is formed over the source stack 102, as shown in FIG. 1. The source contact sacrificial structure 148 may include a first sacrificial material 150, a second sacrificial material 152, and a third sacrificial material 154, each of which is formed by conventional techniques. Materials of the first sacrificial material 150, the second sacrificial material 152, and the third sacrificial material 154 may be selectively etchable relative to one another and relative to other materials of the electronic device 100. However, the first sacrificial material 150 and the third sacrificial material 154 may be the same material (e.g., the same chemical composition) or may be a different material (e.g., a different chemical composition). By way of example only, the first sacrificial material 150, the second sacrificial material 152, and the third sacrificial material 154 may be dielectric materials, such as a silicon oxide material or a silicon nitride material, that are selectively etchable. In some embodiments, the first sacrificial material 150 is a highly conformal silicon dioxide, the second sacrificial material 152 is silicon nitride, and the third sacrificial material 154 is tetraethylorthosilicate (TEOS). However, other combinations of dielectric materials may be used. In addition, the source contact sacrificial structure 148 may be formed of and include two materials or more than three materials.

Removal of the source contact sacrificial structure 148 provides lateral access for the subsequently-formed source contact 120 (see FIGS. 16 and 17) to contact the pillars 130, electrically coupling the source contact 120 to the pillars 130. The location of the source contact sacrificial structure 148 corresponds to the location at which the source contact 120 is ultimately formed, and a total thickness of the as-formed source contact sacrificial structure 148 may be determined by a desired thickness of the source contact 120. Individual thicknesses of each of the first sacrificial material 150, the second sacrificial material 152, and the third sacrificial material 154 may be selected based on the desired thickness of the source contact 120. By way of example only, the first sacrificial material 150 may be formed to a thickness of from about 30 Å to about 400 Å, the second sacrificial material 152 may be formed to a thickness of from about 100 Å to about 300 Å, and the third sacrificial material 154 may be formed to a thickness of from about 30 Å to about 200 Å. The thickness of each of the first sacrificial material 150, the second sacrificial material 152, and the third sacrificial material 154 may be sufficient to protect cell film materials of the pillars 130 and the source stack 102 during subsequently conducted process acts that provide access to the pillars 130 by sequentially removing portions of the cell films.

A second doped semiconductive material 122 is formed adjacent to the source contact sacrificial structure 148 and may be formed by conventional techniques. The second doped semiconductive material 122 may be a dielectric material that is resistant to etch conditions (e.g., etch chemistries and process conditions) used during subsequent process acts, such as to etch conditions used to remove polysilicon-based materials. By way of example only, the second doped semiconductive material 122 may be resistant to phosphoric acid-based etch chemistries, to TMAH, to ammonium hydroxide, to hydrogen fluoride (HF), or to other halogen-based etch chemistries.

The second doped semiconductive material 122 may be a doped silicon nitride material or a doped silicon oxide (e.g., silicon dioxide) material. By way of example only, the second doped semiconductive material 122 may be a carbon-doped semiconductive material, such as a carbon-doped silicon nitride material, a carbon-doped silicon material, or a carbon-doped silicon oxynitride material. In some embodiments, the second doped semiconductive material 122 is carbon-doped silicon. Alternatively, the second doped semiconductive material 122 may be a boron-doped semiconductive material, such as a boron-doped silicon nitride material, a boron-doped silicon material, or a boron-doped silicon oxynitride material. The dopant in the semiconductive material may be present at a concentration sufficient to provide the desired etch selectivity without providing conductivity to the semiconductive material. The dopant concentration may be tailored to achieve the desired etch selectivity of the second doped semiconductive material 122. The dopant may be present in the semiconductive material at a concentration of from about 1% by weight to about 12% by weight. While embodiments herein describe the semiconductive material between the source contact 120 and the tier stack 140' as being a doped semiconductive material, a high-k dielectric material that exhibits the desired etch selectivity may, alternatively, be used. The high-k dielectric material may include, but is not limited to, hafnium oxide (HfO$_x$), aluminum oxide (AlO$_x$), antimony oxide (SbO$_x$), cerium oxide (CeO$_x$), gallium oxide (GaO$_x$), lanthanum oxide (LaO$_x$), niobium oxide (NbO$_x$), titanium oxide (TiO$_x$), zirconium oxide (ZrO$_x$), tantalum oxide (TaO$_x$), magnesium oxide (MgO$_x$), or a combination thereof.

A slit sacrificial structure 160 is formed in the second doped semiconductive material 122, as shown in FIGS. 1 and 2. Tiers 164 of alternating nitride materials 166 and dielectric materials 126 are formed adjacent to (e.g., on) the slit sacrificial structure 160 and the second doped semiconductive material 122, as shown in FIG. 1. The tiers 164 may be formed by conventional techniques. The slit sacrificial structure 160 may be formed of and include one or more materials that are selective etchable relative to the materials of tiers 164. The slit sacrificial structure 160 may also function as an etch stop during subsequent process acts. The slit sacrificial structure 160 may extend through the second doped semiconductive material 122 and, optionally, partially into the third sacrificial material 154 of the source contact sacrificial structure 148. The slit sacrificial structure 160 is formed vertically above the source implant region 112. Additionally, the slit sacrificial structure 160 is formed with a lateral width configured to be less than the lateral width of the source implant region 112. A location of the slit sacrificial structure 160 corresponds to a location adjacent to which (e.g., over which) a slit 170 (see FIG. 4) is subsequently formed. The slit sacrificial structure 160 may, for example, include a dielectric material, a liner, and a etch stop material. By way of example only, the dielectric material may be a silicon oxide material, the liner may be a titanium nitride material, and the etch stop material may be tungsten or a tungsten-containing material. The etch stop material may be configured as a plug. Alternatively, the slit sacrificial structure 160 may be formed of a single material, such as aluminum oxide, two materials, or more than three materials as long as the material(s) provide the desired etch selectivity and etch stop functions.

A pillar opening is formed through the tiers 164 and at least partially into the first doped semiconductive material 108, exposing surfaces of the tiers 164, the second doped semiconductive material 122, the source contact sacrificial structure 148, and the first doped semiconductive material 108. The pillar opening may be formed by conventional techniques, such as by conventional photolithography and removal processes. The portions of the tiers 164, the second doped semiconductive material 122, the source contact sacrificial structure 148, and the first doped semiconductive material 108 may be removed by one or more conventional etch processes, such as a conventional dry etch process. Cell films of the pillars 130 are formed in the pillar opening, as shown in FIG. 1. The charge blocking material 140, the charge trap material 138, the tunnel dielectric material 136, and the channel 134 may be conformally formed in the pillar opening by conventional techniques. The first fill material 132 may be formed in a remaining volume of the pillar opening by conventional techniques. One or more voids may be present in the interior of the first fill material 132. The charge blocking material 140, the charge trap material 138, the tunnel dielectric material 136, the channel 134, and the first fill material 132 are positioned in order from the outermost material to the innermost material relative to an axial centerline of the pillar 130. As shown in FIG. 2, pillars 130 are positioned between adjacent slit sacrificial structures 160. By way of example only, the pillars 130 may be arranged in columns of staggered rows and laterally spaced from one another.

The charge blocking material 140 may be formed of and include a dielectric material. By way of example only, the charge blocking material 140 may be one or more of an oxide (e.g., silicon dioxide), a nitride (silicon nitride), and an oxynitride (silicon oxynitride), or another material. In some embodiments, the charge blocking material 140 is silicon dioxide.

The charge trap material 138 may be formed of and include at least one memory material and/or one or more conductive materials. The charge trap material 138 may be formed of and include one or more of silicon nitride, silicon oxynitride, polysilicon (doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material (e.g., polycrystalline or amorphous semiconductor material, including at least one elemental semiconductor element and/or including at least one compound semiconductor material, such as conductive nanoparticles (e.g., ruthenium nanoparticles) and/or metal dots). In some embodiments, charge trap material 138 is silicon nitride.

The tunnel dielectric material 136 may include one or more dielectric materials, such as one or more of a silicon nitride material or a silicon oxide material. In some embodiments, the tunnel dielectric material 136 is a so-called "ONO" structure that includes silicon dioxide, silicon nitride, and silicon dioxide.

The channel 134 may be formed of and include a semiconductive material, a non-silicon channel material, or other channel material. The material of the channel may include, but is not limited to, a polysilicon material (e.g., polycrystalline silicon), a III-V compound semiconductive material, a II-VI compound semiconductive material, an organic semiconductive material, GaAs, InP, GaP, GaN, an oxide semiconductive material, or a combination thereof. In some embodiments, the channel 134 is polysilicon, such as a doped polysilicon. The channel 134 may be configured as a so-called doped hollow channel (DHC) or other configuration. The first fill material 132 may be a dielectric material, such as silicon dioxide.

Figure 3:
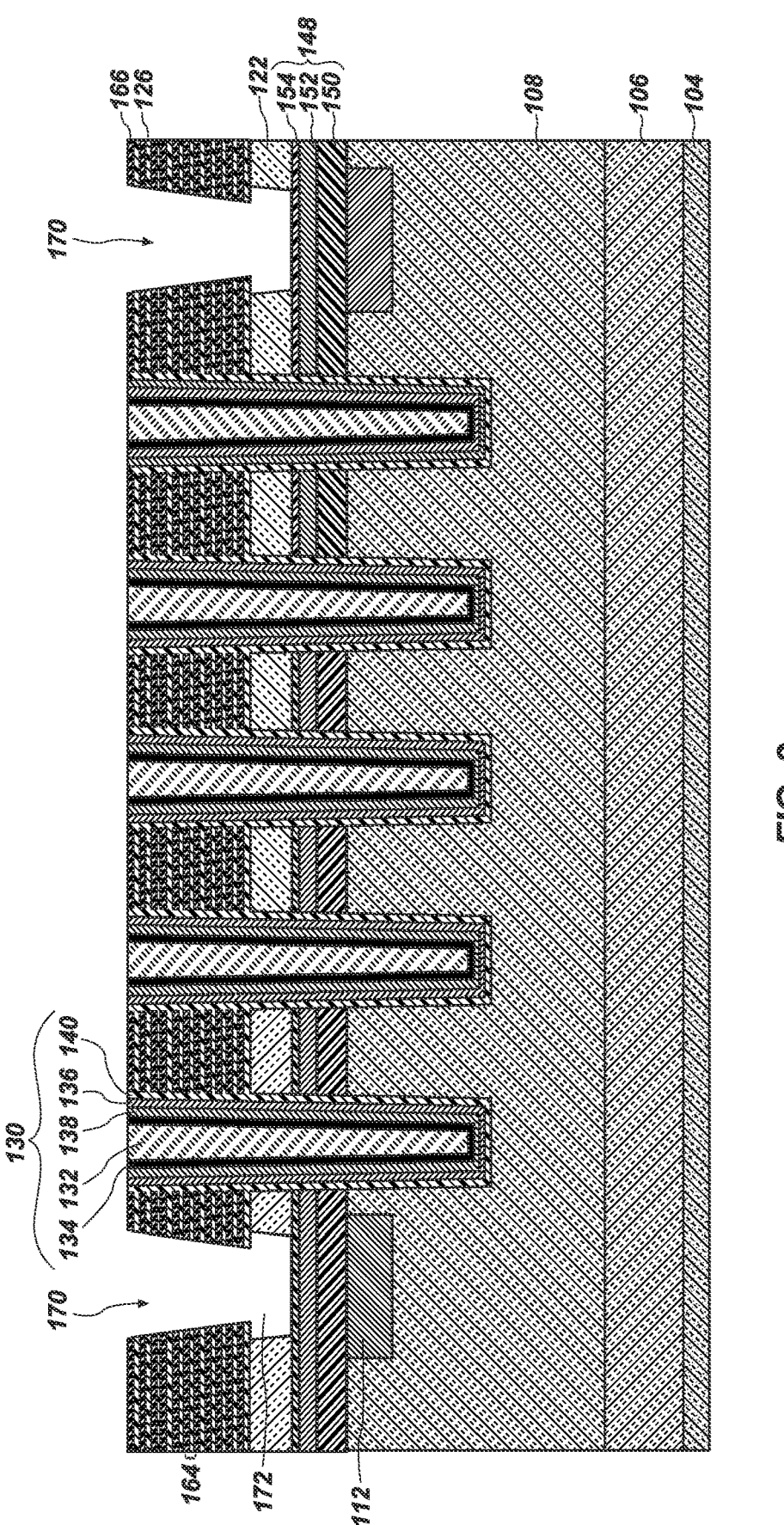

A portion of the tiers 164 and the slit sacrificial structure 160 is removed, as shown in FIG. 3, to form a slit 170 through the tiers 164 and a lower opening 172 in the second doped semiconductive material 122, exposing the source contact sacrificial structure 148. The tiers 164 and the slit sacrificial structure 160 may be removed by one or more etch processes, such as by using conventional etch conditions. The slit sacrificial structure 160 may be substantially completely removed or at least the liner and the etch stop material of the slit sacrificial structure 160 are removed, with a portion of the dielectric material, optionally, remaining adjacent to the second doped semiconductive material 122. If a single etch process is conducted, the tiers 164 and the slit sacrificial structure 160 may be substantially removed by the single etch process. If more than one etch process is conducted, the etch stop material of the slit sacrificial structure 160 may function as an etch stop during the first etch process to form the slit 170 and a second etch process may be conducted to remove the slit sacrificial structure 160. For convenience, the slit 170 and the lower opening 172 are collectively referred to hereinafter as the slit 170. The slit sacrificial structure 160 is formed vertically above the source implant region 112. Additionally, the slit sacrificial structure 160 is formed with a lateral width configured to be less than the lateral width of the source implant region 112. While FIG. 3 illustrates the slit 170 as extending through the tiers 164 and the second doped semiconductive material 122 to an upper surface of the third sacrificial material 154, the slit 170 may extend partially into the third sacrificial material 154.

Figure 4:
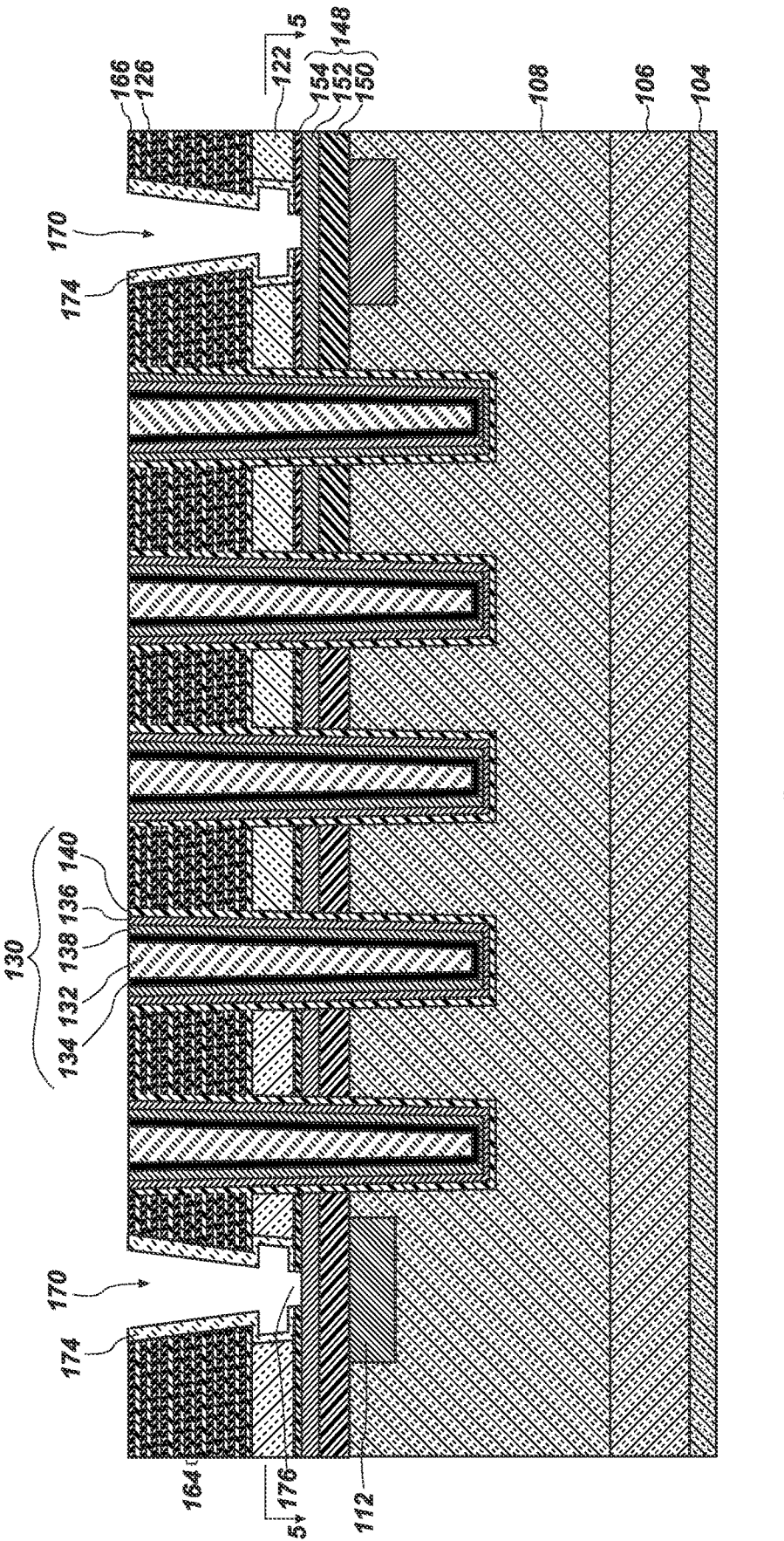
Figure 5:
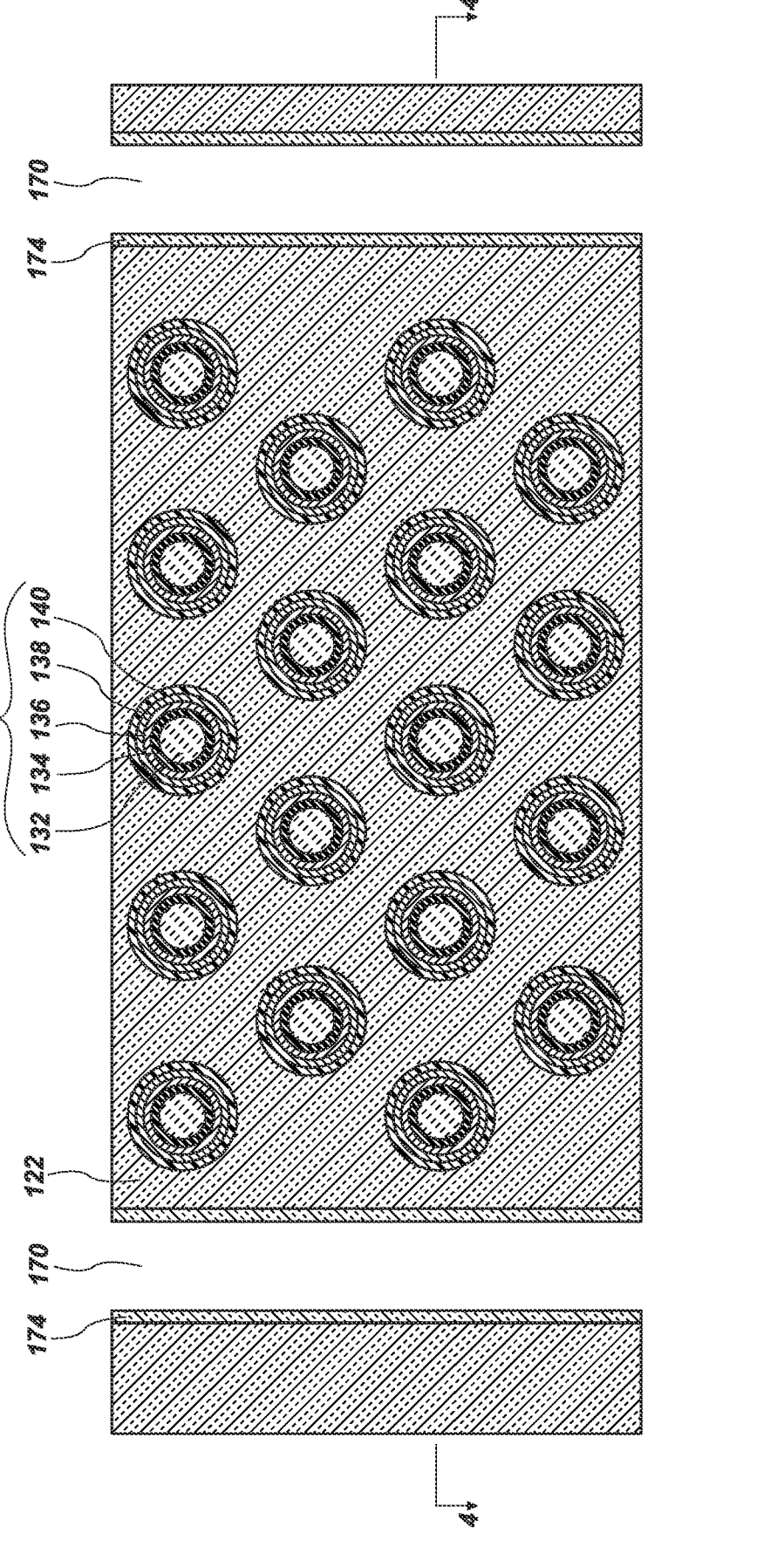

FIG. 4 is a cross-sectional schematic illustration taken through the line 4-4 in FIG. 5, and FIG. 5 is a cross-sectional schematic illustration taken through the line 5-5 in FIG. 4. As shown in FIGS. 4 and 5, a slit liner 174 is formed on exposed surfaces of the tiers 164, the slit sacrificial structure 160, and the third sacrificial material 154 in the slit 170. The slit liner 174 may be conformally formed by conventional techniques such that a portion (e.g., a volume) of the slit 170 remains open (e.g., unoccupied). The slit liner 174 may be formed of and include a dielectric material, a semiconductive material, or a conductive material. In some embodiments, the slit liner 174 is undoped polysilicon. The slit liner 174 may be formed to a thickness of from about 200 Å to about 400 Å. A portion of the slit liner 174 is removed from a bottom surface of the slit 170 to form a slit liner opening 176, exposing the third sacrificial material 154 of the source contact sacrificial structure 148, which is also removed. The slit liner 174 and the third sacrificial material 154 at the bottom surface of the slit 170 may be removed by conventional techniques.

Figure 6:
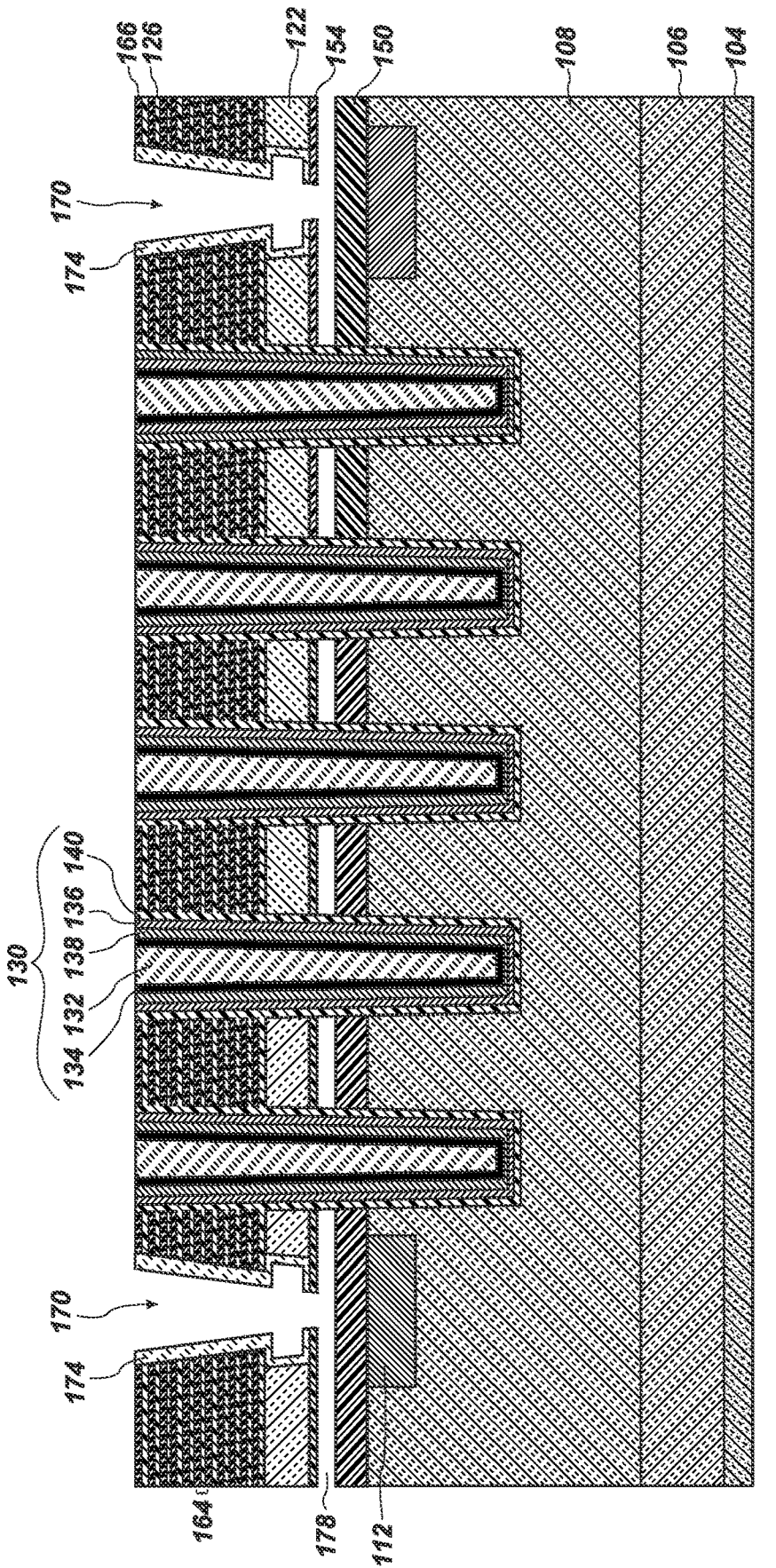

To provide access to the pillars 130, the source contact sacrificial structure 148 and portions of the cell films (charge blocking material 140, charge trap material 138, tunnel dielectric material 136) are sequentially removed, as shown in FIGS. 6-10. The source contact sacrificial structure 148 is removed while a majority of the second doped semiconductive material 122 remains intact (e.g., unetched) by selecting the etch conditions used to remove the source contact sacrificial structure 148. In other words, the second doped semiconductive material 122 is substantially resistant to the etch conditions used to remove the source contact sacrificial structure 148. The second sacrificial material 152 is removed through the slit 170, as shown in FIG. 6, and a first source contact opening 178 formed. As described below, the size of the first source contact opening 178 is sequentially increased (e.g., enlarged) to provide access to the pillars 130 following the removal of the source contact sacrificial structure 148.

The second sacrificial material 152 of the source contact sacrificial structure 148 is selectively removed without substantially removing the first and third sacrificial materials 150, 154 or the charge blocking material 140. The second sacrificial material 152 may be selectively etched by conventional techniques, such as by conventional etch conditions, which are selected depending on the chemical composition of the second sacrificial material 152 relative to the chemical composition of other exposed materials. Since the first sacrificial material 150, the third sacrificial material 154, and the charge blocking material 140 may be similar materials and exhibit slower etch rates than the etch rate of the second sacrificial material 152, the second sacrificial material 152 is substantially removed relative to the first sacrificial material 150, the third sacrificial material 154, and the charge blocking material 140. By way of example only, if the first sacrificial material 150, the third sacrificial material 154, and the charge blocking material 140 are silicon oxide materials and the second sacrificial material 152 is a silicon nitride material, an etch chemistry formulated to remove silicon nitride may be used, such as a phosphoric acid-based etch chemistry. The second doped semiconductive material 122 is not exposed to (e.g., is protected from) the etch conditions by the slit liner 174, the tiers 164, and the third sacrificial material 154.

Figure 7:
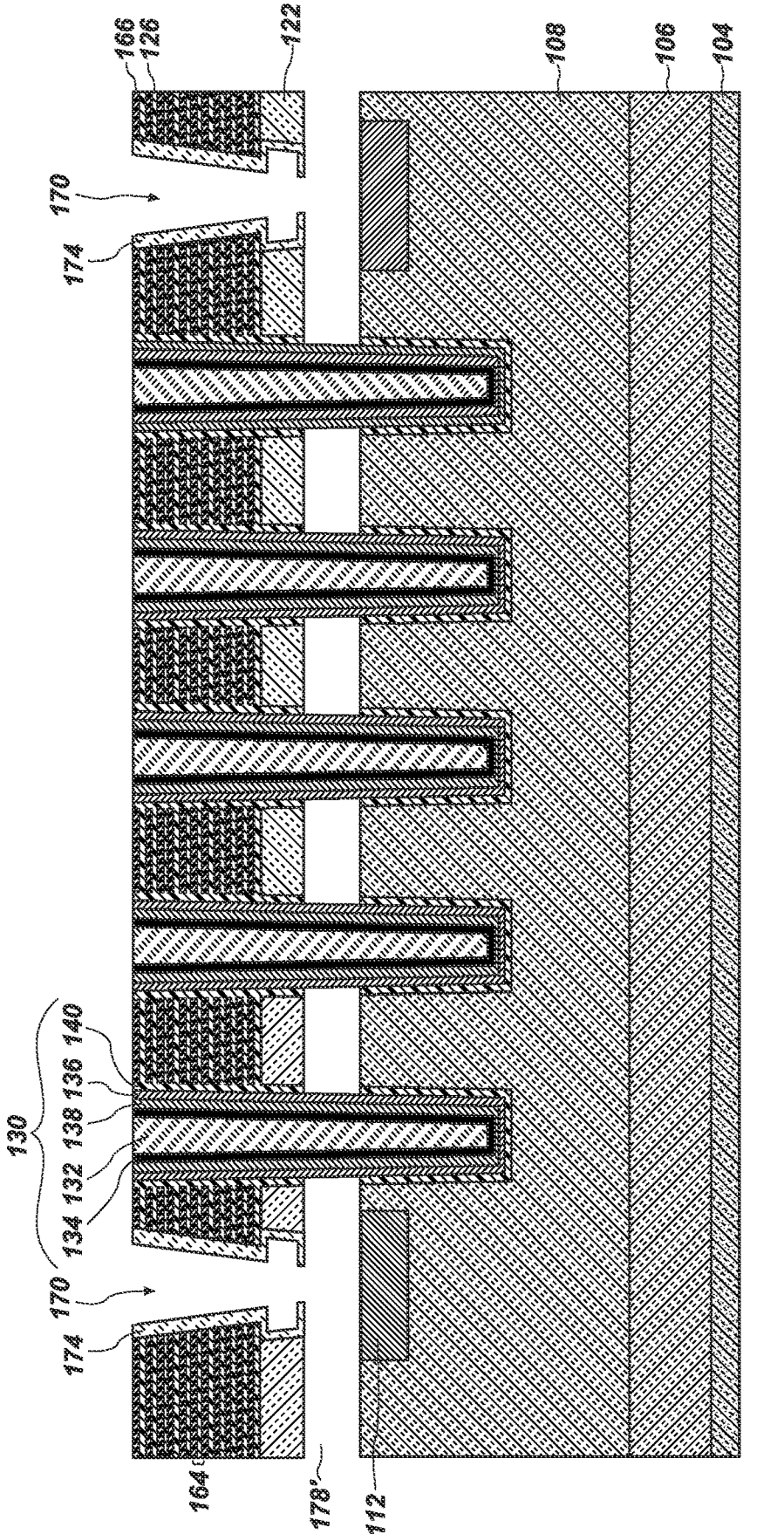
Figure 8:
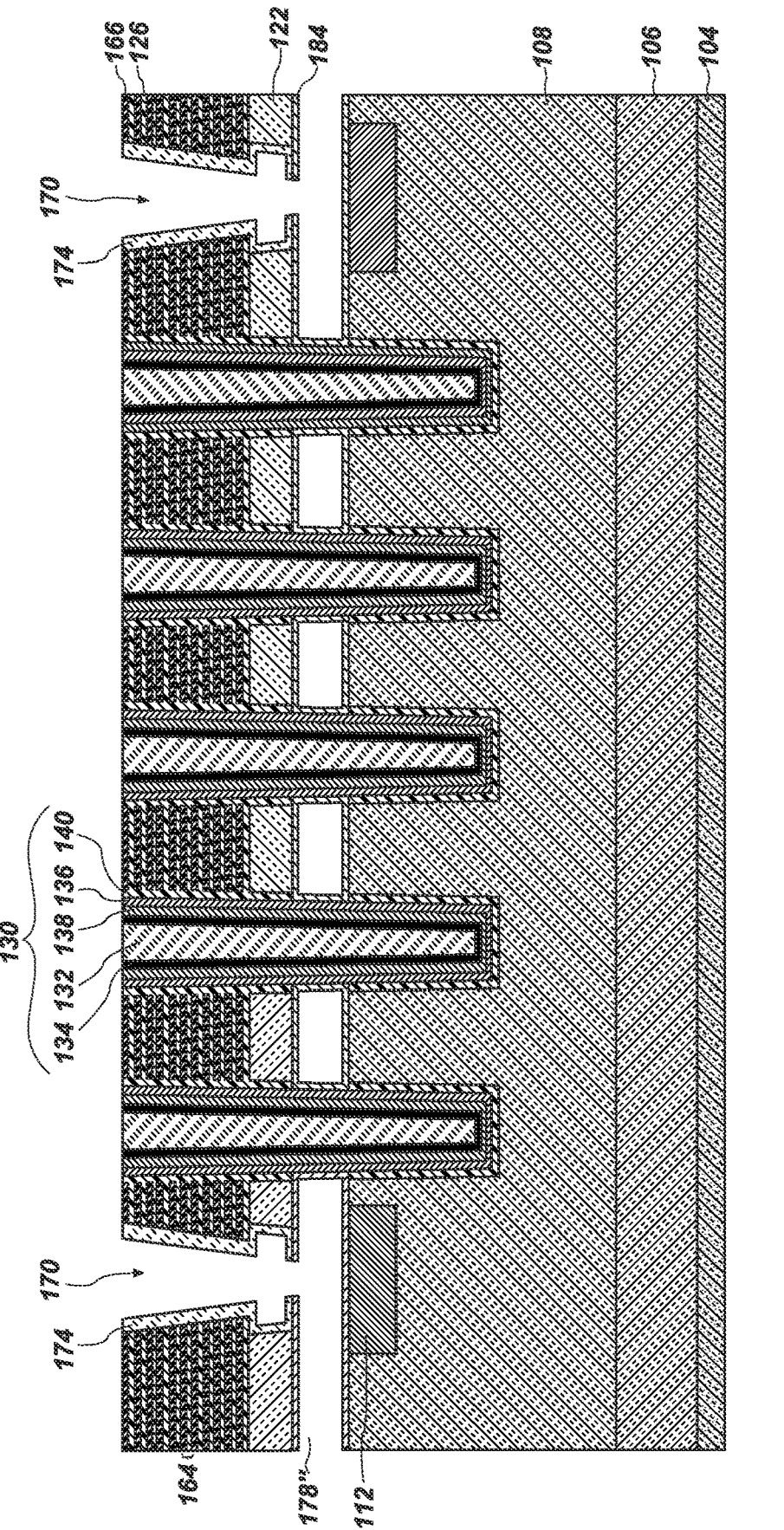

As shown in FIG. 7, an exposed portion of the charge blocking material 140, the first sacrificial material 150, and the third sacrificial material 154 are selectively removed without substantially removing the slit liner 174. The charge blocking material 140, the first sacrificial material 150, and the third sacrificial material 154 may be selectively etched by conventional techniques, which are selected depending on the chemical composition of the charge blocking material 140, the first sacrificial material 150, and the third sacrificial material 154 relative to the chemical composition of other exposed materials. By selecting the etch conditions, the charge blocking material 140 adjacent to the first source contact opening 178, the first sacrificial material 150, and the third sacrificial material 154 are removed. The first sacrificial material 150 and third sacrificial material 154 may be substantially completely removed while the exposed portion of the charge blocking material 140, adjacent (e.g., laterally adjacent) to the first source contact opening 178, is removed. Removing the first sacrificial material 150, the third sacrificial material 154, and the portions of the charge blocking material 140 increases the size of the first source contact opening 178, forming first source contact opening 178'. In some embodiments, the second doped semiconductive material 122 is carbon-doped silicon nitride and is selectively etchable relative to silicon dioxide of the source contact sacrificial structure 148 and silicon dioxide of the pillars 130.

By way of example only, if the first sacrificial material 150, the third sacrificial material 154, and the charge blocking material 140 are silicon oxide materials, an etch chemistry formulated to selectively remove silicon oxide materials may be used, such as an HF-based etch chemistry. Forming the first source contact opening 178' exposes a top surface of the first doped semiconductive material 108 and a top surface of the source implant region 112. Forming the first source contact opening 178' also exposes a bottom horizontal surface of the second doped semiconductive material 122 and exposes a portion of the charge trap material 138. The bottom surface of the second doped semiconductive material 122 may be substantially coplanar with a bottom surface of the slit liner 174, while a bottom horizontal surface of the charge blocking material 140 may be recessed relative to (e.g., not coplanar with) the bottom surfaces of the second doped semiconductive material 122 and the slit liner 174.

A source contact opening liner 184 is formed within the first source contact opening 178' forming the first source contact opening 178". The source contact opening liner 184 may be formed along the top surfaces of the first doped semiconductive material 108 and the source implant region 112, along the bottom surfaces of the second doped semiconductive material 122 and the slit liner 174, and along the exposed portions of the charge trap material 138 and the charge blocking material 140. By way of example only, the source contact opening liner 184 may be a dielectric material, such as a silicon oxide material or a silicon nitride material, that exhibits etch selectivity relative to other exposed materials. In some embodiments, the source contact opening liner 184 is a highly conformal silicon dioxide.

Figure 9:
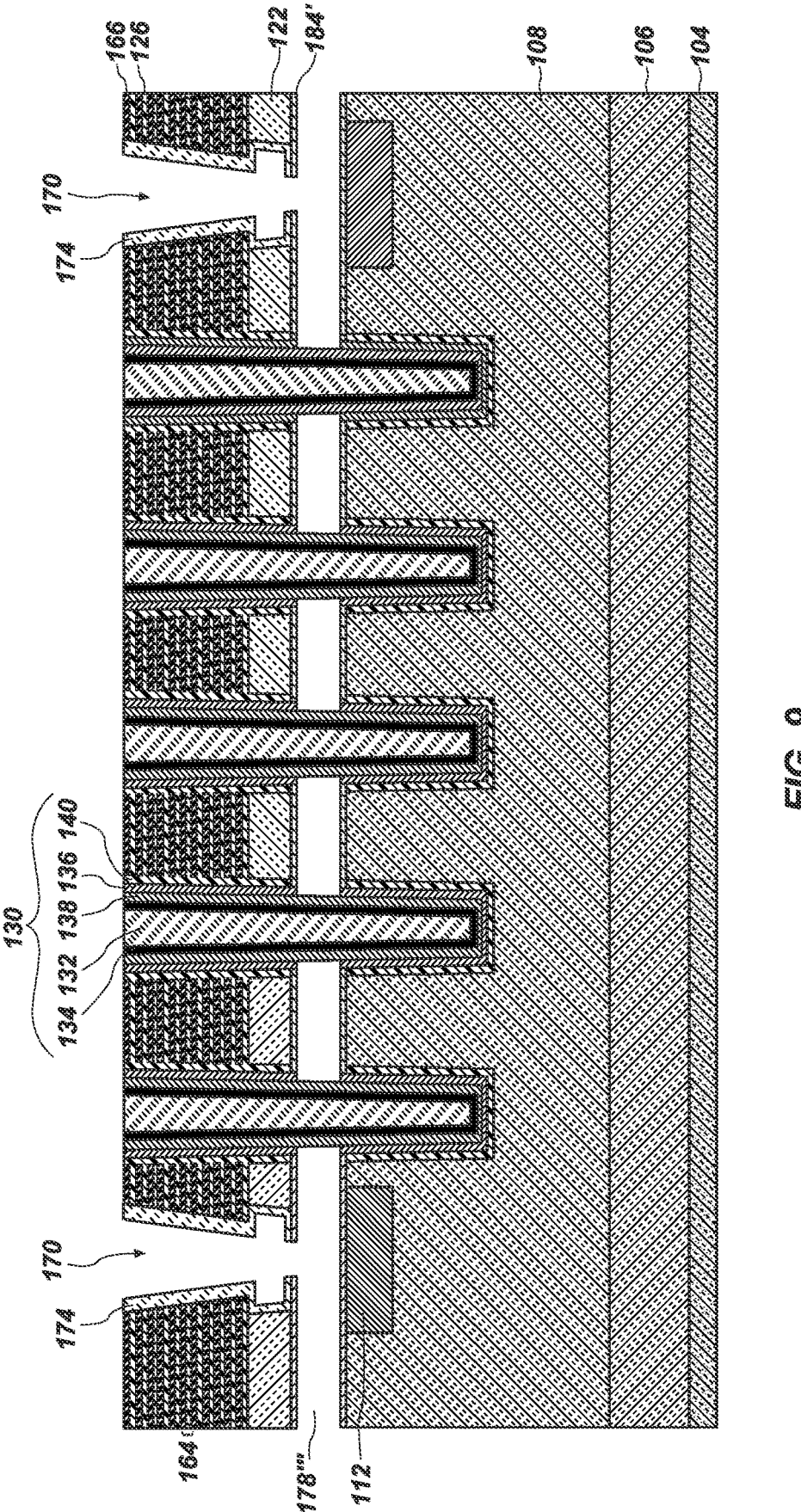

The exposed portion of the charge trap material 138 is then selectively removed, as shown in FIG. 9, without substantially removing the slit liner 174 or the source contact opening liner 184' from vertical surfaces. The portion of the charge trap material 138 and portion of the source contact opening liner 184 that is laterally adjacent to the first source contact opening 178''' is removed by selectively etching the charge trap material 138, which exposes a portion of the tunnel dielectric material 136. The charge trap material 138 and source contact opening liner 184 may be removed by conventional techniques. By way of example only, if the charge trap material 138 is a silicon nitride material, an etch chemistry formulated to remove silicon nitride may be used, such as a phosphoric acid-based etch chemistry. By selecting the etch conditions, the charge trap material 138 laterally adjacent to the first source contact opening 178''' is removed.

Figure 10:
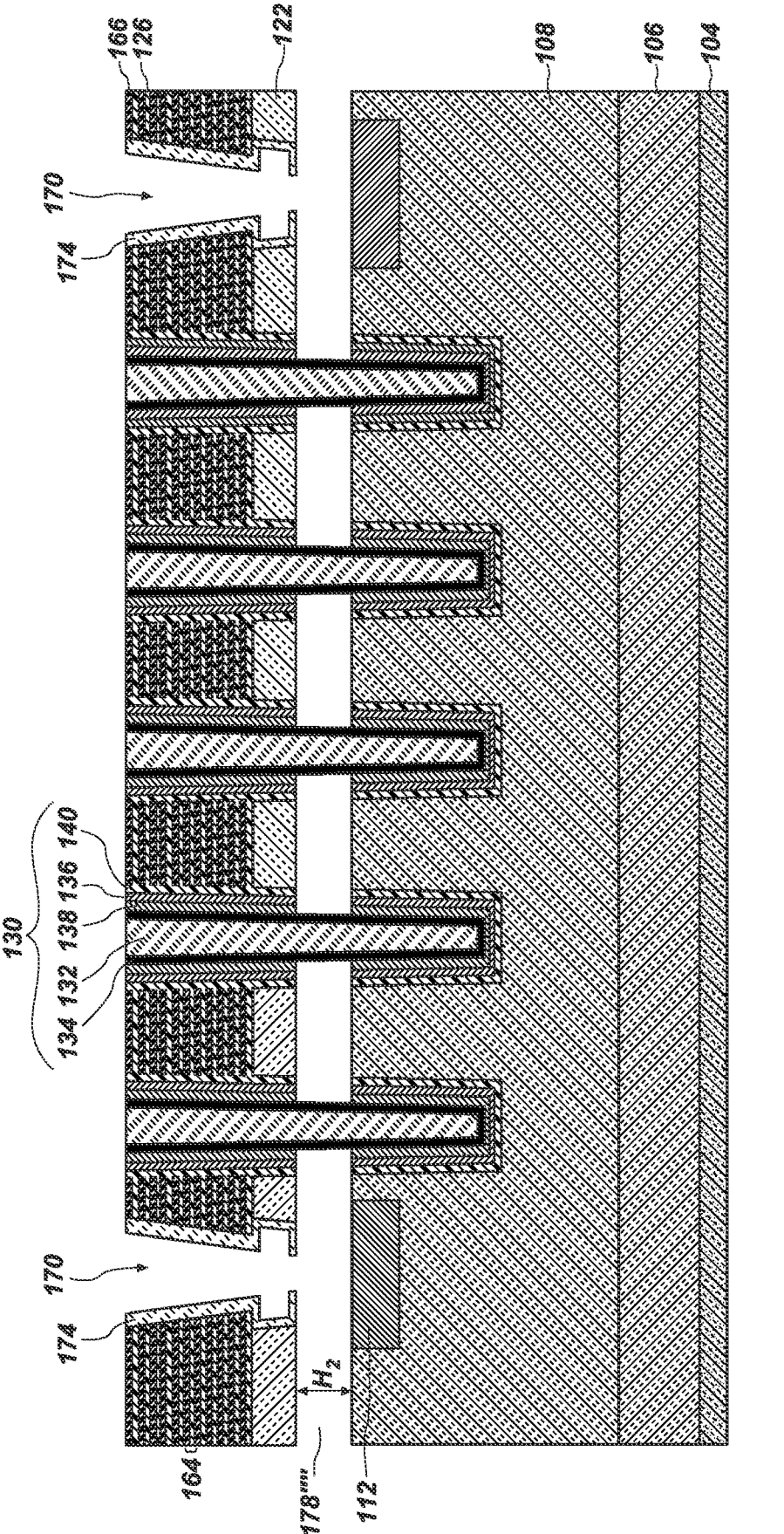

As shown in FIG. 10, the exposed portion of the tunnel dielectric material 136 is selectively removed, along with the remaining portion of the source contact opening liner 184', increasing the size of the first source contact opening 178''' and forming first source contact opening 178''''. The portion of the tunnel dielectric material 136 laterally adjacent to the first source contact opening 178'''' is removed by selectively etching the tunnel dielectric material 136 relative to the second doped semiconductive material 122. Removing the tunnel dielectric material 136 also exposes a portion of the channel 134. The exposed portion of the tunnel dielectric material 136 may be removed by conventional techniques. By selecting the etch conditions, the tunnel dielectric material 136 laterally adjacent to the first source contact opening 178'''' is removed. By way of example only, if the tunnel dielectric material 136 is an ONO material, the etch chemistry may include, but is not limited to, an HF-based etch chemistry. The exposed portion of the channel 134 may ultimately be in contact with the source contact 120 (see FIGS. 11-17).

Figure 16:
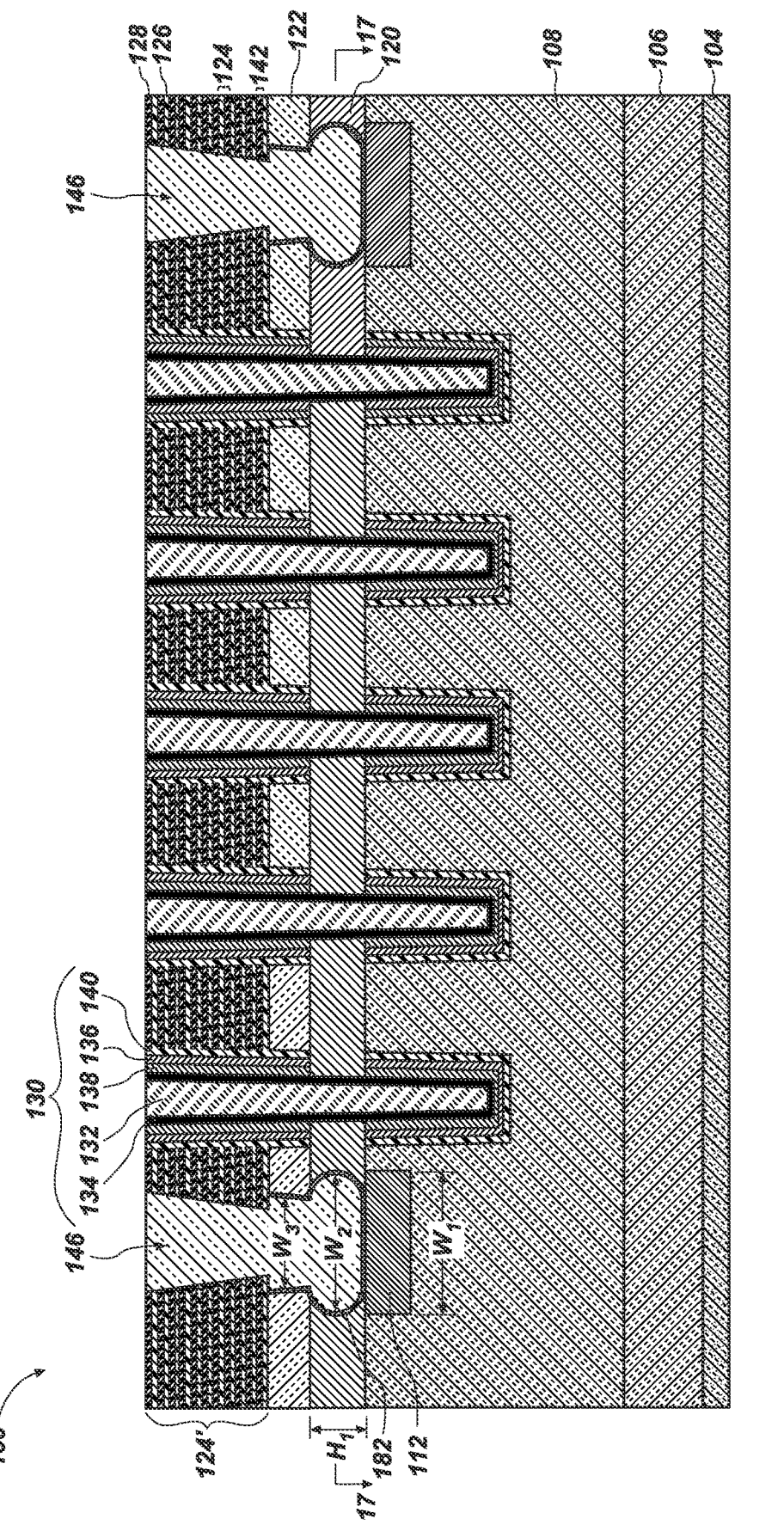
FIGS. 16 and 17 are cross-sectional, elevational, schematic illustrations of an electronic device in accordance with embodiments of the disclosure.

The second doped semiconductive material 122 may function as an offset between the source stack 102 and the tiers 124 during the fabrication of the electronic device 100 (see FIG. 16). Since the first sacrificial material 150, the second sacrificial material 152, and the third sacrificial material 154 of the source contact sacrificial structure 148 provide protection to (e.g., masking of) various materials during the process acts indicated in FIGS. 4-7, the initial thicknesses of the first sacrificial material 150, the second sacrificial material 152, and the third sacrificial material 154 are selected to be sufficiently thick to survive (e.g., withstand) the etch conditions used to provide lateral access to the channel 134 of the pillars 130. The first source contact opening 178'''' exhibits a height Hi, which corresponds to a thickness of the source contact 120 ultimately formed in the first source contact opening 178''''. The thickness of the source contact 120 (see FIG. 16) is greater than or equal to a combined thickness of the materials of the as-formed source contact sacrificial structure 148 (see FIG. 3). By determining the desired thickness of the source contact 120, the thickness of the source contact sacrificial structure 148 may be selected.

While the first sacrificial material 150, the second sacrificial material 152, and the third sacrificial material 154 have been removed (e.g., are not present) in the perspective of FIG. 16, these materials of the source contact sacrificial structure 148 may be present in other portions (not shown) of the electronic device 100, such as in portions of the electronic device 100 distal to the slit 170. The source contact sacrificial structure 148 may be present (e.g., visible), for example, in peripheral regions of the electronic device 100. In other words, the source contact sacrificial structure 148 may be positioned between the first doped semiconductive material 108 and the second doped semiconductive material 122 in the other portions of the electronic device 100. Therefore, although the source contact 120 is present between the second doped semiconductive material 122 and the source stack 102 of the electronic device 100 in the perspectives shown in FIGS. 11-17, the other portions of the electronic device 100 will include the source contact sacrificial structure 148 between the second doped semiconductive material 122 and the source stack 102.

The first source contact opening 178"" may provide access (e.g., lateral access) to the pillars 130 following the substantially complete removal of the source contact sacrificial structure 148, which exposes the channel 134. While FIG. 16 illustrates the exposed horizontal surfaces of the tunnel dielectric material 136 and the charge trap material 138 proximal to the second doped semiconductive material 122 as being substantially coplanar with each other and with the exposed horizontal surfaces of the second doped semiconductive material 122, the exposed horizontal surfaces of the charge trap material 138 may, alternatively, be recessed relative to the exposed horizontal surfaces of the tunnel dielectric material 136 depending on the etch conditions used. The exposed horizontal surfaces of the charge trap material 138 may be recessed to a point intermediate that of the exposed horizontal surfaces of the charge blocking material 140 and the tunnel dielectric material 136. The exposed horizontal surfaces of the tunnel dielectric material 136 may also be recessed relative to the exposed horizontal surfaces of the second doped semiconductive material 122 and of the charge trap material 138. Therefore, the size of the first source contact opening 178"" may be further increased proximal to the pillars 130.

Figure 11:
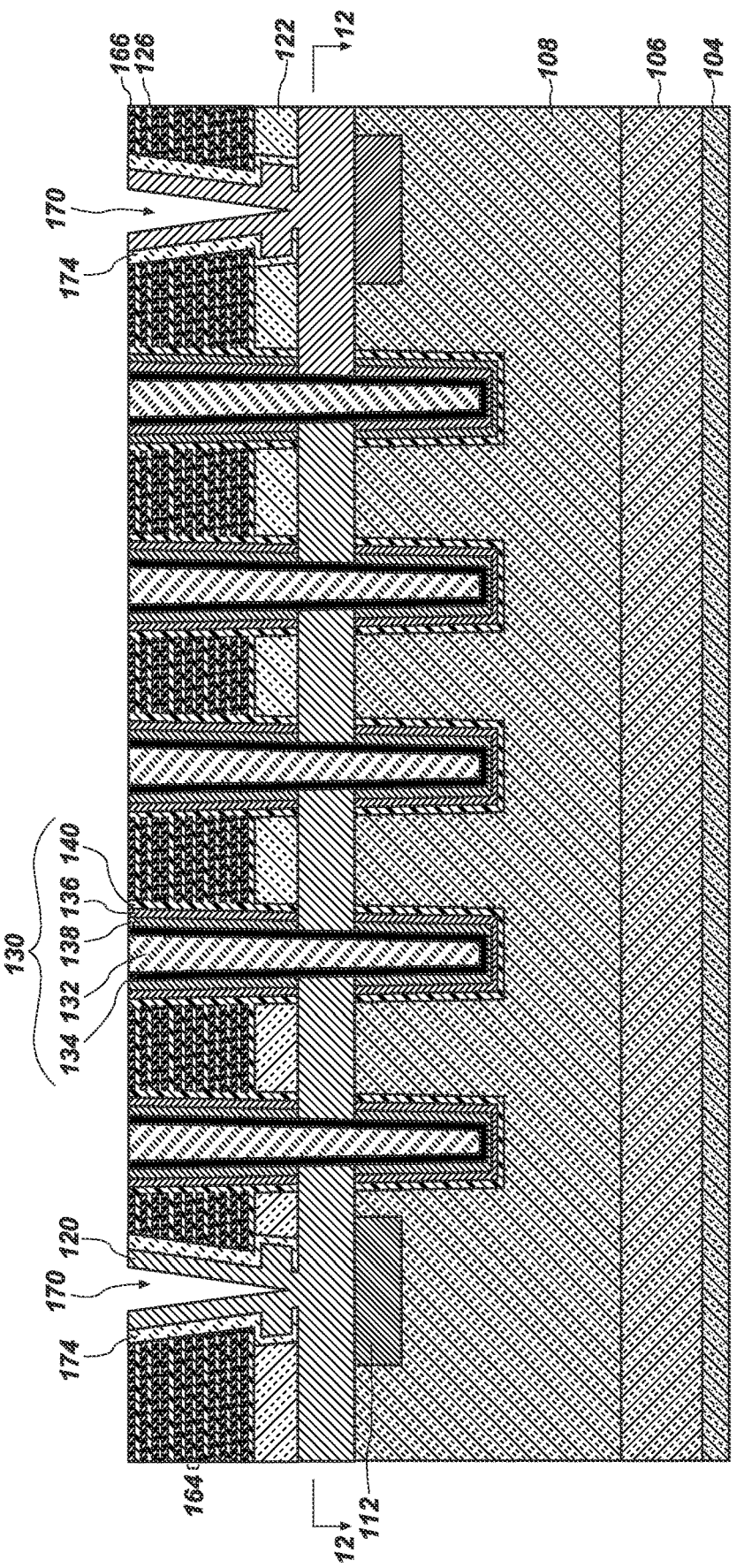
Figure 12:
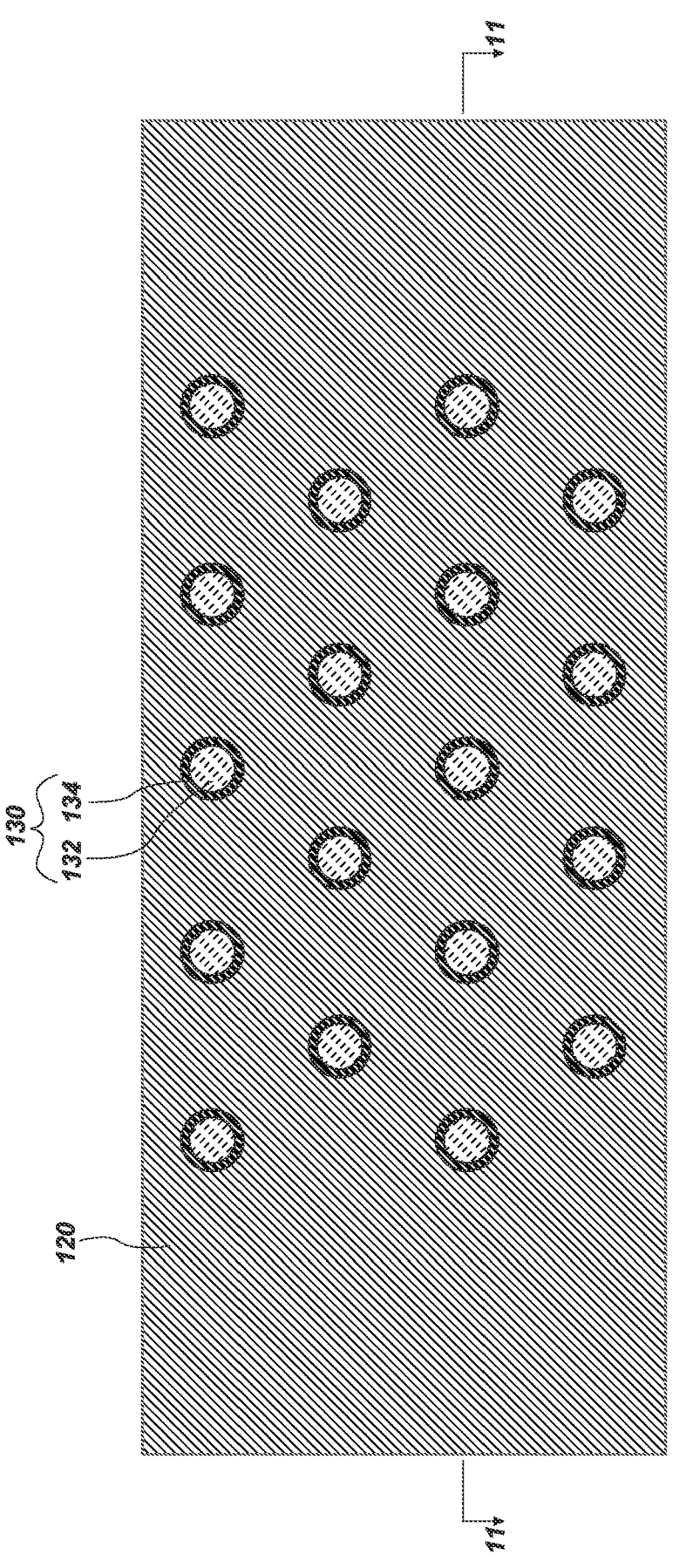

FIG. 11 is a cross-sectional schematic illustration taken through the line 11-11 in FIG. 12, and FIG. 12 is a cross-sectional schematic illustration taken through the line 12-12 in FIG. 11. As shown in FIGS. 11 and 12, a conductive material 120' of the source contact 120 is formed within the first source contact opening 178"". The conductive material 120' may be conformally formed in the first source contact opening 178"", substantially completely filling the first source contact opening 178"" and filling a portion of the slit 170. In some embodiments, the conductive material 120' is polysilicon, such as N$^+$ doped polysilicon. The conductive material 120' may be formed at a thickness of from about 500 Å to about 2000 Å, such as from about 700 Å to about 1500 Å, from about 700 Å to about 1800 Å, from about 800 Å to about 1500 Å, from about 800 Å to about 1800 Å, or from about 800 Å to about 1800 Å. The conductive material 120' extends in a horizontal direction between the second doped semiconductive material 122 and the first doped semiconductive material 108 and contacts the pillars 130. An oxidation act may be conducted to activate dopants in the conductive material 120' and so that the conductive material 120' is substantially continuous and includes few holes, voids, or a seam.

Figure 13:
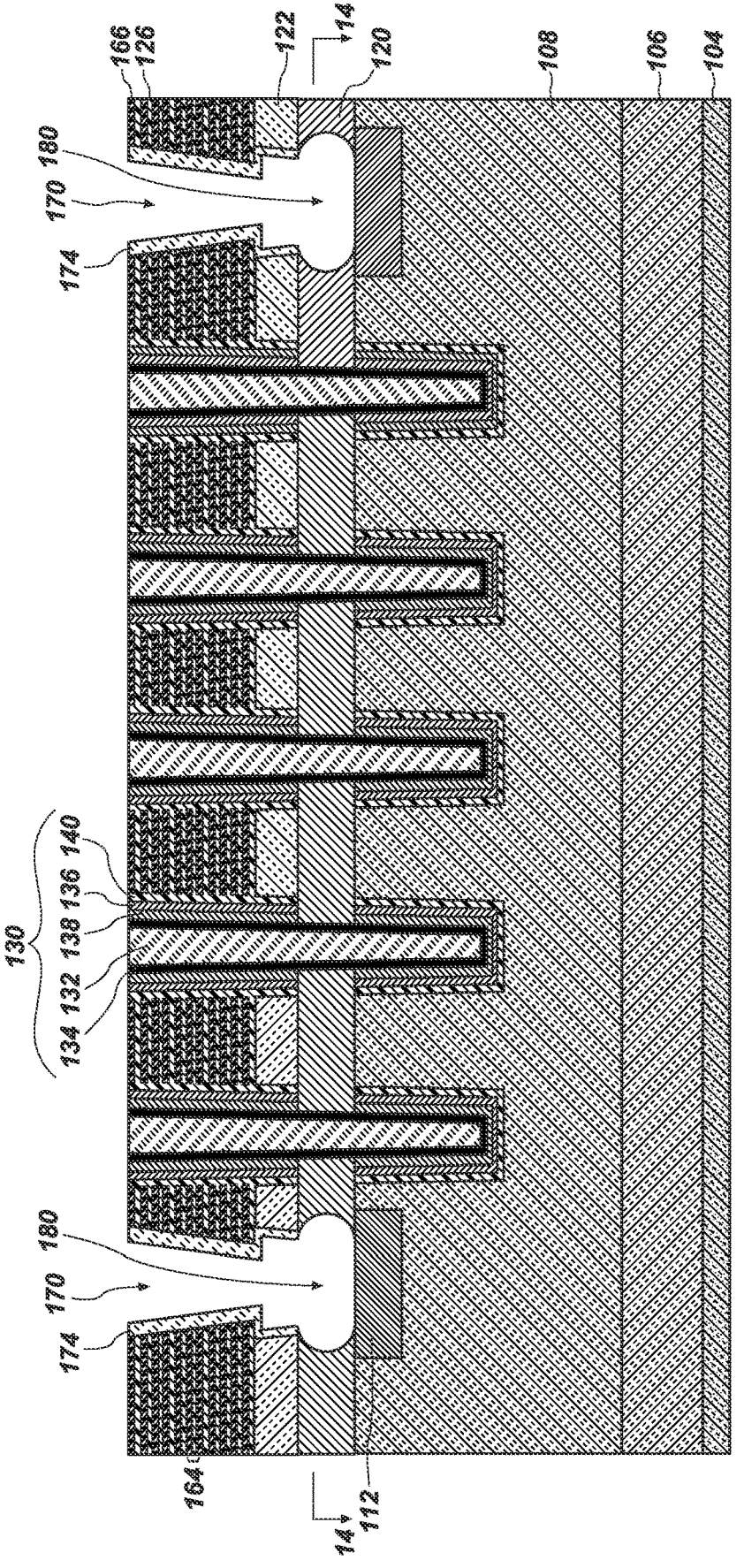
Figure 14:
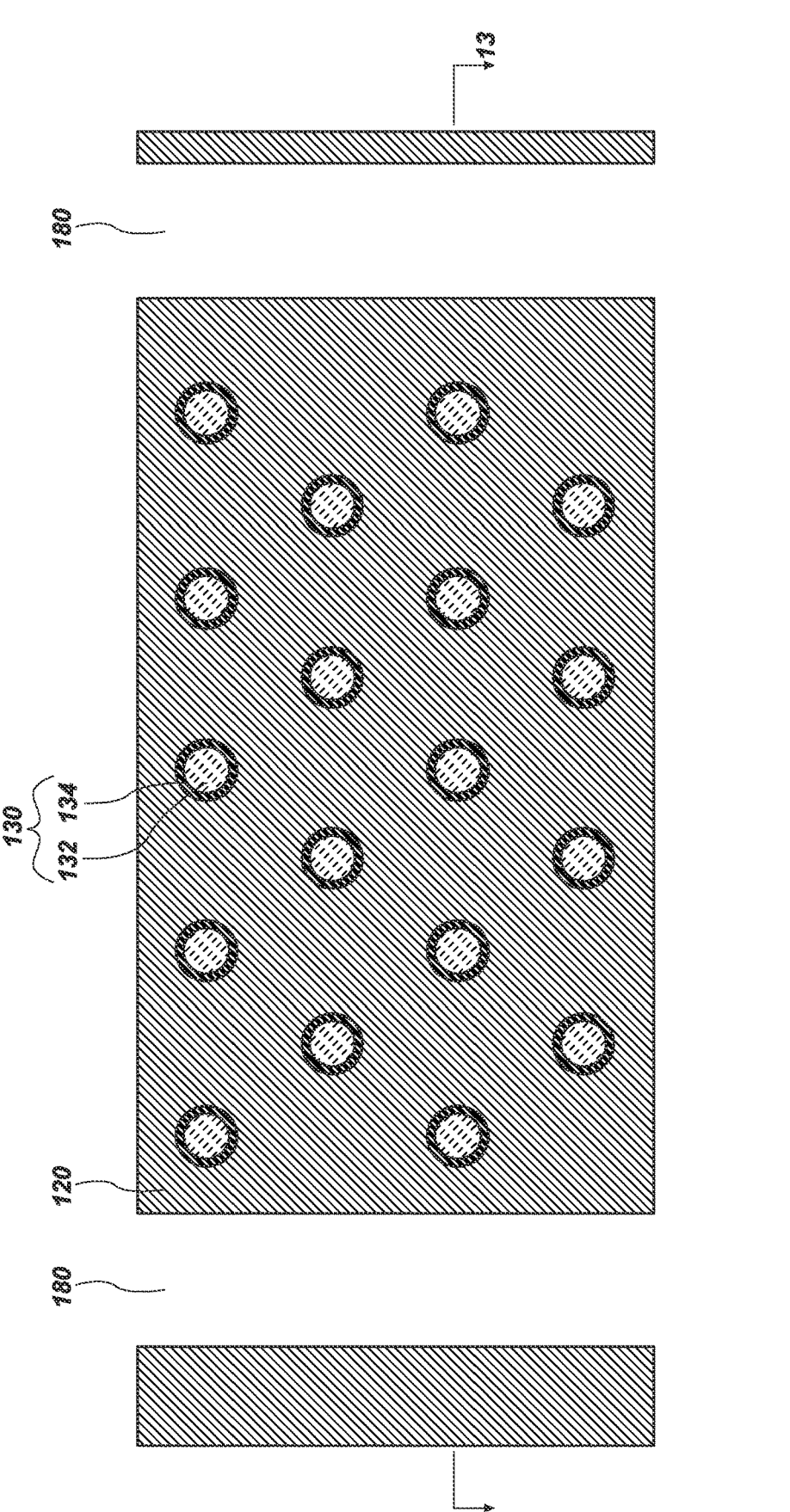

FIG. 13 is a cross-sectional schematic illustration taken through the line 13-13 in FIG. 14, and FIG. 14 is a cross-sectional schematic illustration taken through the line 14-14 in FIG. 13. Referring to FIGS. 13 and 14, the etch selectivity of the source implant region 112 enables the conductive material 120' to be removed laterally without removing the first doped semiconductive material 108 to form a second source contact opening 180. The conductive material 120' is removed from the slit 170 and from the portion of the first source contact opening 178"" proximal to the source implant region 112 while the conductive material 120' remains in the remaining first source contact opening 178"", which forms the source contact 120. As shown in FIGS. 13 and 14, the second source contact opening 180 may include an undercut region that extends in a lateral direction relative to the source contact 120. The second source contact opening 180 may also extend in a lateral direction below the second doped semiconductive material

122. A bottom portion of the second source contact opening 180, therefore, is wider than other portions of the second source contact opening 180. While FIG. 13 illustrates that sidewalls defining the second source contact opening 180 may be curved, the sidewalls defining the second source contact opening 180 may, alternatively, be linear or substantially linear. An amount of the conductive material 120' may be removed so that a width of the second source contact opening 180 in the lateral direction is narrower than the width in the lateral direction of the source implant region 112. The amount of the conductive material 120' may be removed so that the width of the second source contact opening 180 in the lateral direction is substantially the same as, or wider than, the width in the lateral direction of the source implant region 112. The conductive material 120' is removed by conventional techniques. The resulting source contact 120 extends between the second doped semiconductive material 122 and the first doped semiconductive material 108 and contacts (e.g., directly contacts) the channel 134, the tunnel dielectric material 136, the charge trap material 138, and the charge blocking material 140 of the pillars 130. The source contact 120 directly contacts a lower surface of the second doped semiconductive material 122 and an upper surface of the first doped semiconductive material 108. The source contact 120 also directly contacts upper and lower horizontal surfaces of the tunnel dielectric material 136, the charge trap material 138, and the charge blocking material 140 and sidewalls of the channel 134. The source contact 120 is separated from the tiers 164 by the second doped semiconductive material 122.

Figure 15:
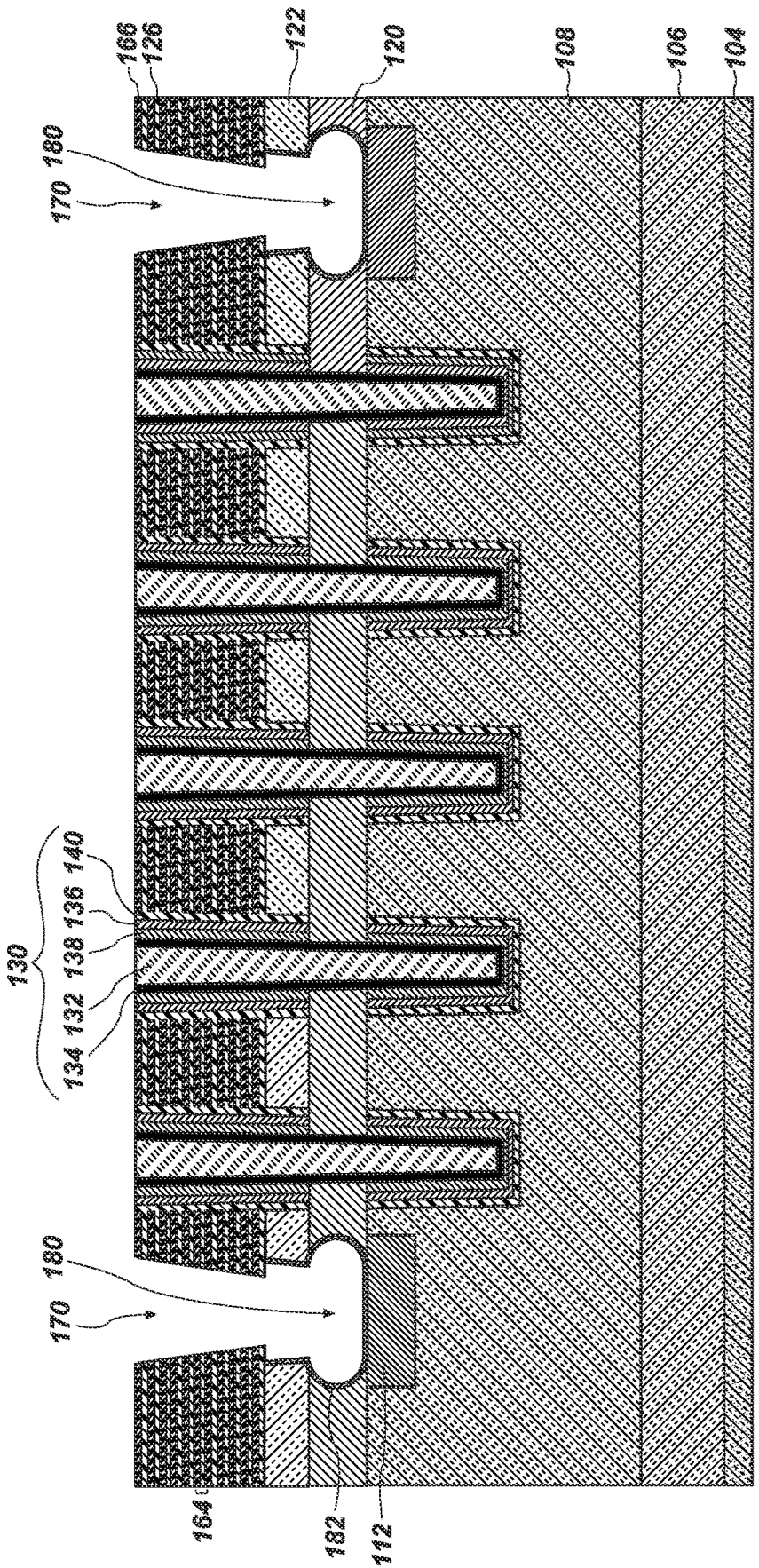

Referring to FIG. 15, a portion of the source contact 120 exposed through the slit 170 and second source contact opening 180 may be removed, further recessing the source contact 120 adjacent to (e.g., horizontal to) the second source contact opening 180. The exposed portion of the source contact 120 may be oxidized by conventional techniques to form a source contact liner 182 of the source contact 120. The source contact liner 182 may be present on sidewalls of the second doped semiconductive material 122, the source contact 120, and the source implant region 112. The source contact liner 182 may extend to a bottom surface of the lowermost dielectric materials 126 of the tiers 164. In this way the source contact liner 182 may form a continuous liner from the bottom surface of the lowermost dielectric materials 126 of the tiers, along sidewalls of the second doped semiconductive material 122 and the source contact 120, and along the upper surface of the source implant region 112.

The tunnel dielectric material 136, the charge trap material 138, and the charge blocking material 140 are not continuous over the entire height of the pillars 130 since the portions adjacent to (e.g., laterally adjacent to) the source contact 120 have been removed. Therefore, the portions of the tunnel dielectric material 136, the charge trap material 138, and the charge blocking material 140 below the source contact 120 are not in direct contact with the portions above the source contact 120.

Figure 17:
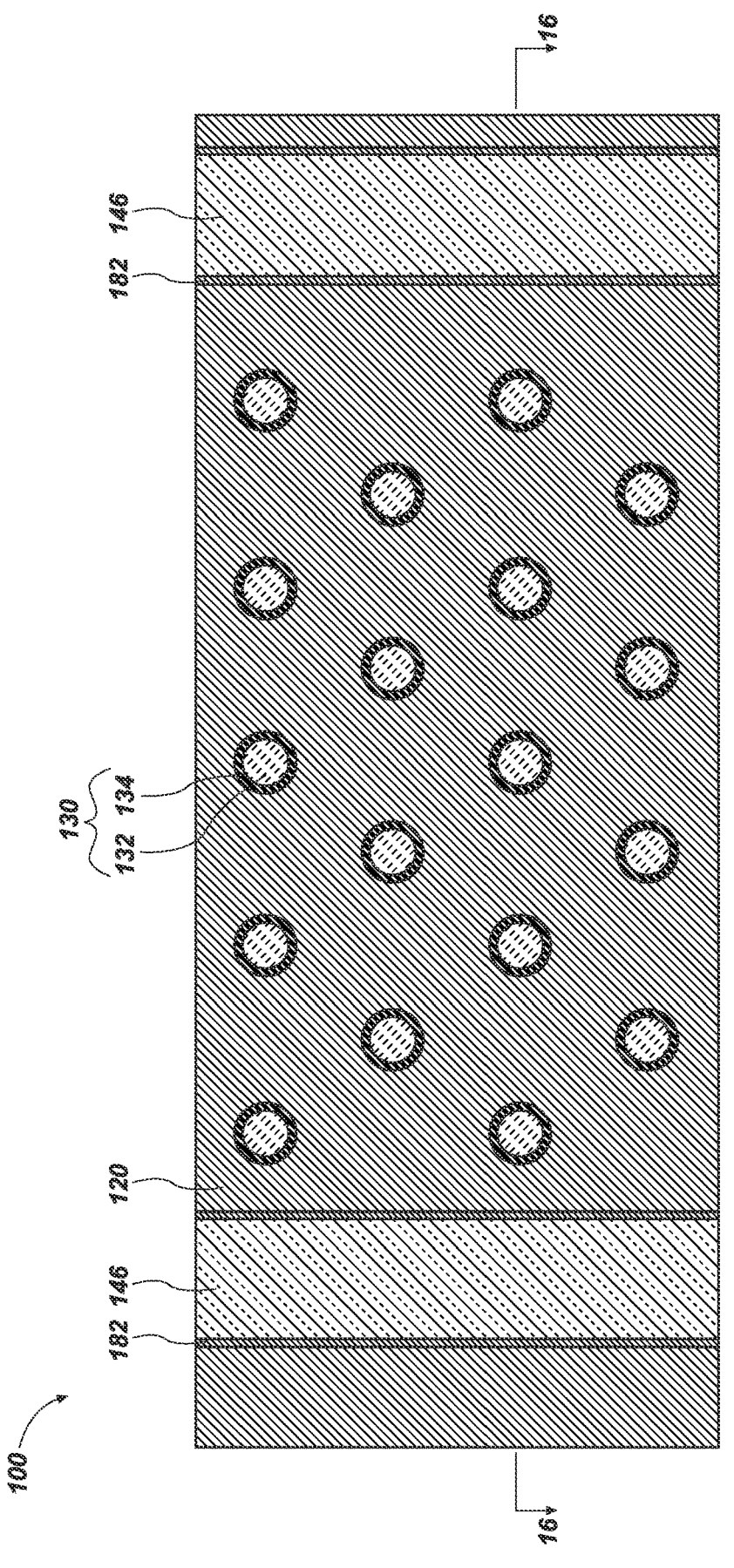

Subsequent process acts are then conducted by conventional techniques to form the electronic device 100 as shown in FIGS. 16 and 17. FIG. 16 is a cross-sectional schematic illustration taken through the line 16-16 in FIG. 17, and FIG. 17 is a cross-sectional schematic illustration taken through the line 17-17 in FIG. 16. By way of example only, a replacement gate process is conducted to remove the nitride materials 166 of the tiers 164 and to form the conductive materials 128 of the tiers 124. The nitride materials 166 may be removed by exposing the tiers 164 to a wet etch chemistry formulated to remove, for example, silicon nitride of the tiers 164. The wet etchant may include, but is not limited to, one or more of phosphoric acid, sulfuric acid, hydrochloric acid, nitric acid, or a combination thereof. In some embodiments, the nitride materials 166 of the tiers 164 are removed using a so-called "wet nitride strip" that includes phosphoric acid. While FIGS. 1-17 illustrate the formation of the electronic device 100 by the replacement gate process, methods according to embodiments of the disclosure may be used to form the electronic device 100 by a floating gate process.

A second fill material 146 may be formed in the slit 170 and second source contact opening 180. The second fill material 146 may comprise one or more materials such as a single dielectric material, a combination of a dielectric material and silicon, or a combination of a dielectric material and a conductive material. As shown in the cross-section view of FIG. 16, the second fill material 146 exhibits different widths in the lateral direction, with a lower portion of the second fill material 146 exhibiting one or more different widths than an upper portion of the second fill material 146. As the undercut regions of the second source contact opening 180 are filled with the second fill material 146, the second fill material 146 exhibits different widths in the lower portion than in the upper portion. The second fill material 146 is formed above (e.g., vertically above) the source implant region 112, and the width $W_2$ of the second fill material 146 laterally adjacent to the source contact 120 may be narrower than the width $W_1$ of the source implant region 112. In some embodiments the width $W_2$ of the portion of the second fill material 146 may be substantially the same as or wider than the width $W_1$ of the source implant region 112. The width $W_3$ of the portion of the second fill material 146 laterally adjacent to the second doped semiconductive material 122 may be smaller than the width $W_1$ of the source implant region 112. The width $W_3$ of the portion of the second fill material 146 laterally adjacent to the second doped semiconductive material 122 may be more narrow than the width $W_2$ of the source implant region 112. The different widths of the second fill material 146 may be present in some regions of the electronic device 100, such as in one or more or array regions, periphery regions of the electronic device 100.

The electronic device 100 includes a source stack 102 as described in the processing act described in reference to FIG. 1, including a source implant region 112. A source contact 120 is adjacent to (e.g., vertically adjacent to, on) the source stack 102 and includes a source contact liner 182. A second doped semiconductive material 122 is adjacent to (e.g., vertically adjacent to, on) the source contact 120. A material of the second doped semiconductive material 122 is selected to be selectively removable under some etch conditions and to be resistant to removal under other etch conditions.

Tiers 124 of alternating dielectric materials 126 and conductive materials 128 are adjacent to (e.g., vertically adjacent to, on) the second doped semiconductive material 122. Some of the conductive materials 128 are configured as so-called "replacement gate" word lines (e.g., word lines formed by a so-called "replacement gate" or "gate late" process). Other conductive materials 128, such as one or more of the lowermost conductive materials 128, are configured as select gate sources (SGS) 142 and one or more of the uppermost conductive materials 128 are configured as select gate drains.

In addition to providing the desired etch selectivity, the second doped semiconductive material 122 may be easily integrated into the process of forming the electronic device 100 according to embodiments of the disclosure. The second doped semiconductive material 122 may function as a so-called "capping material" to prevent removal processes from removing portions of the dielectric materials 126 of the tiers 124 during removal of the cell films. The second doped semiconductive material 122 also provides improved channel conductance at the source contact 120, by avoiding shielding the electrical field from the SGS 142 of the tiers 124.

The thickness of the second doped semiconductive material 122 may be selected depending on a desired distance between the source contact 120 and the SGS 142 of the tier stack 140' (see FIG. 16). The thickness of the second doped semiconductive material 122 may be sufficient to separate (e.g., physically separate) the source contact 120 from the SGS 142 by a desired distance. The second doped semiconductive material 122 may also function as an etch stop material during subsequent process acts. In some embodiments, the thickness of the second doped semiconductive material 122 is about 500 Å.

Pillars 130 (e.g., memory pillars) extend through the tiers 124, the second doped semiconductive material 122, the source contact 120, and at least partially into the first doped semiconductive material 108. The pillars 130 include a first fill material 132, a channel 134, a tunnel dielectric material 136, a charge trap material 138, and a charge blocking material 140. The tunnel dielectric material 136, the charge trap material 138, and the charge blocking material 140 function as tunneling structures of the pillars 130 of the electronic device 100. One or more of the tiers 124 proximal to the second doped semiconductive material 122 functions as a select gate source (SGS) 142 and one or more of the tiers 124 distal to the second doped semiconductive material 122 functions as a select gate drain (SGD). The tiers 124 form a tier stack 140' adjacent to the second doped semiconductive material 122. The distance separating the source contact 120 from the SGS 142 of the tiers 124, corresponds to the thickness of the second doped semiconductive material 122 and the adjacent dielectric material 126 of the tiers 124.

The second fill material 146 is adjacent to (e.g., vertically adjacent to, on) the source implant region 112, and adjacent to (e.g., laterally adjacent to, next to) the source contact 120, the second doped semiconductive material 122, and the tiers stack 124'. The source contact liner 182 is deposed between the second fill material 146 and the source implant region 112, the source contact 120, and the second doped semiconductive material 122.

One or more electronic device 100 according to embodiments of the disclosure may be present in an apparatus or in an electronic system. The apparatus including the one or more electronic device 100, or the electronic system including the one or more electronic device 100 may include additional components, which are formed by conventional techniques. The additional components may include, but are not limited to, staircase structures, interdeck structures, contacts, interconnects, data lines (e.g., bit lines), access lines (e.g., word lines), etc. The additional components may be formed during the fabrication of the electronic device 100 or after the electronic device 100 has been fabricated. By way of example only, one or more of the additional components may be formed before or after the cell films of the pillars 130 are formed, while other additional components may be formed after the electronic device 100 has been fabricated. The additional components may be present in locations of the electronic device 100 or the apparatus that are not depicted in the perspectives of FIGS. 1-17.

During formation of the electronic device 100 according to embodiments of the disclosure, the source implant region 112 provides corrosion protection to the source stack 102. This protection allows for the source contact 120 to contact the conductive materials 128, while mitigating corrosion of the source material 106, through which the source contact 120 may electrically short to the source material 106. The electron flow through the channel 134 is also improved. In addition, by eliminating the cell films (the tunnel dielectric material 136, the charge trap material 138, the charge blocking material 140) in a conductive path between the channel 134 and the SGS 142, sources of charge trap within the conductive path are reduced or eliminated. The second doped semiconductive material 122 also provides a process margin during the fabrication of the electronic device 100. Therefore, electrical control of the electronic device 100 according to embodiments of the disclosure is improved relative to that of conventional electronic devices having a doped polysilicon material in a similar location, where interactions between a channel and memory cells of the conventional electronic devices occur.

Figure 18:
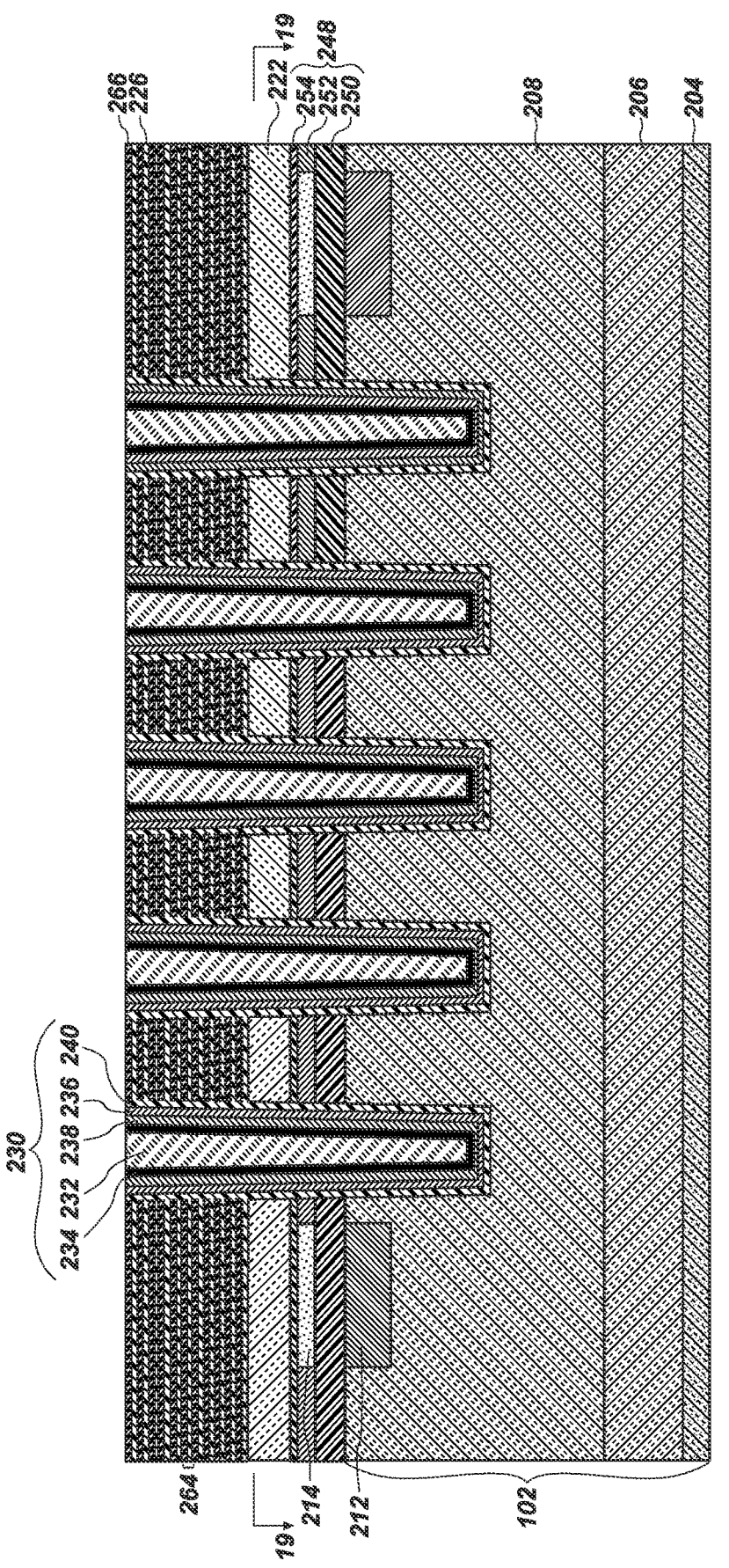
FIGS. 18-31 are cross-sectional, elevational, schematic illustrations during various processing acts to fabricate an electronic device in accordance with embodiments of the disclosure.
Figure 19:
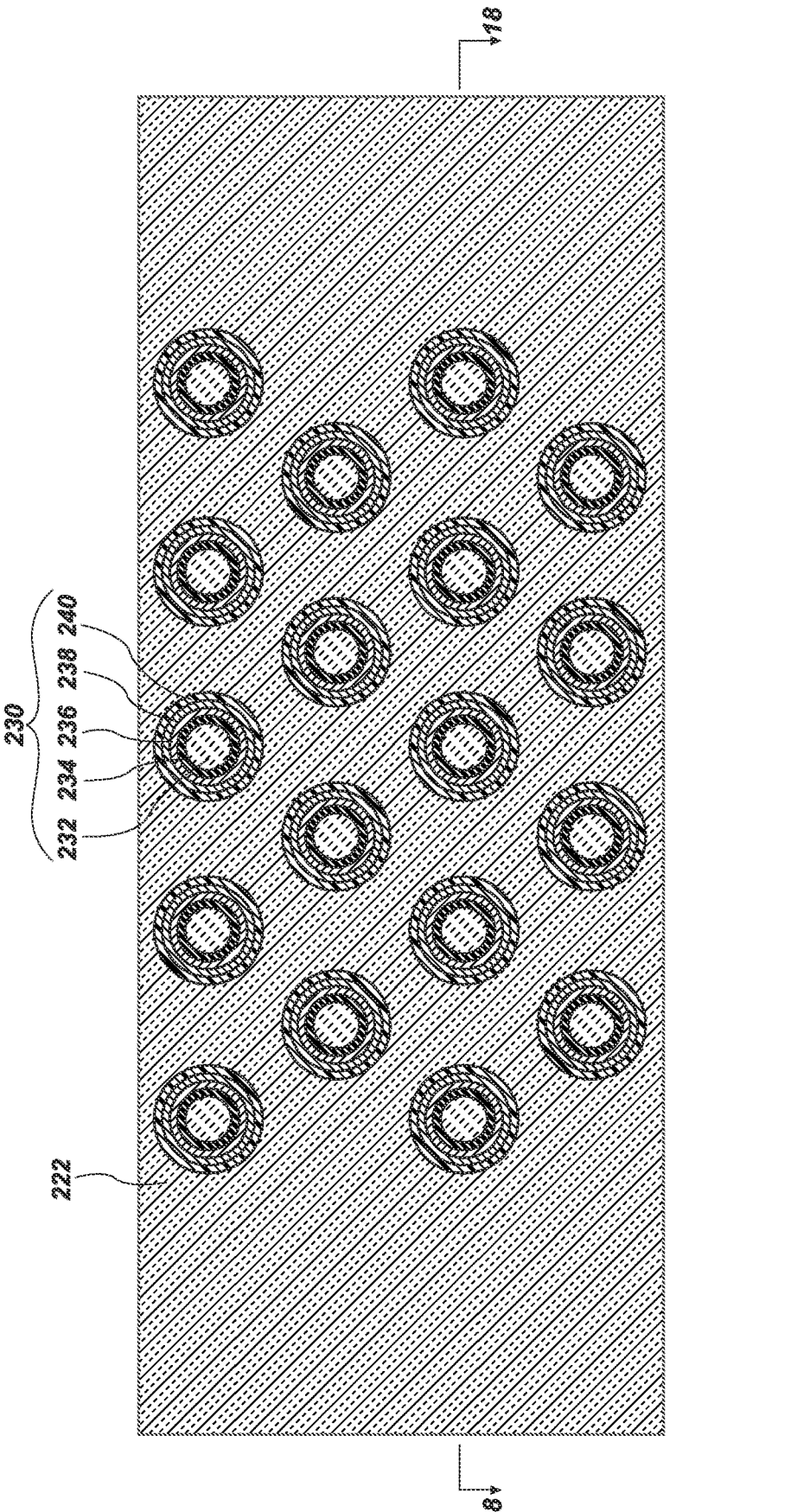

An additional embodiment of the invention is shown in FIGS. 18 through 33, which illustrate the formation of electronic device 200. The elements and materials of the electronic device 200 are substantially the same as those described above for FIGS. 1-17, unless the context indicates otherwise. FIG. 18 is a cross-sectional schematic illustration taken through the line 18-18 in FIG. 19, and FIG. 19 is a cross-sectional schematic illustration taken through the line 19-19 in FIG. 18. As shown in FIG. 18, a plug 214 is formed in the second sacrificial material 252 rather than using the slit sacrificial structure 160 as described above with FIGS. 1 and 2. A hardmask may be formed adjacent to the first sacrificial material 250. The hardmask may be used to control the distribution of the source implant region 212. The source implant region 212 may be formed substantially similarly to the previous embodiment.

The plug 214 may be formed adjacent (e.g., vertically adjacent to) to the first sacrificial material 250. The hardmask may be used to control the longitudinal width and location of the plug 214. The plug 214 may be located vertically (e.g., above) the source implant region 212. The plug 214 is formed with a lateral width configured to be the substantially the same as the lateral width $W_1$ of the source implant region 212. The location of the plug 214 corresponds to a location adjacent to which (e.g., over which) a slit 270 (see FIG. 20) is subsequently formed. The plug 214 may, for example, include a dielectric material, a liner, and a etch stop material. By way of example only, the dielectric material may be a silicon oxide material, the liner may be a titanium nitride material, and the etch stop material may be tungsten or a tungsten-containing material. Alternatively, the plug 214 may be formed of a single material, such as aluminum oxide, two materials, or more than three materials as long as the material(s) provide the desired etch selectivity and etch stop functions. The hardmask may be removed to expose the upper surface of the first sacrificial material 250. By using the same hardmask to form the implant region 212 and the plug 214, this embodiment may employ one less process act for preparing the electronic device 200 when compared to the electronic device 100.

Similar to the first embodiment, a source contact sacrificial structure 248 is formed over the source stack 202, as shown in FIG. 18. In this second embodiment, the plug 214, is within (e.g., embedded in) the second sacrificial material 252, with the first and a third sacrificial materials 250, 254, respectively, below and above the plug 214. The second doped semiconductive material 222, tiers 264, and pillar 230 may be formed as described in the previous embodiment. Pillars 230 may be positioned as described in the previous embodiment.

A location of the source contact sacrificial structure 248 corresponds to the location at which the source contact 220 is ultimately formed, and a total thickness of the as-formed source contact sacrificial structure 248 may be determined by a desired thickness of the source contact 220. Individual thicknesses of each of the first sacrificial material 250, the second sacrificial material 252, and the third sacrificial material 254 may be selected based on the desired thickness of the source contact 220. The thickness of the plug 214 and the second sacrificial material 252 may be configured to be the same, such that they are collectively form a single plane. By way of example only, the first sacrificial material 250 may be formed to a thickness of from about 30 Å to about 400 Å, the plug 214 and second sacrificial material 252 may be formed to a thickness of from about 100 Å to about 300 Å, and the third sacrificial material 254 may be formed to a thickness of from about 30 Å to about 200 Å. The thickness of each of the first sacrificial material 250, the second sacrificial material 252, and the third sacrificial material 254 may be sufficient to protect cell film materials of the pillars 230 and the source stack 202 during subsequently conducted process acts that provide access to the pillars 230 by sequentially removing portions of the cell films.

Figure 20:
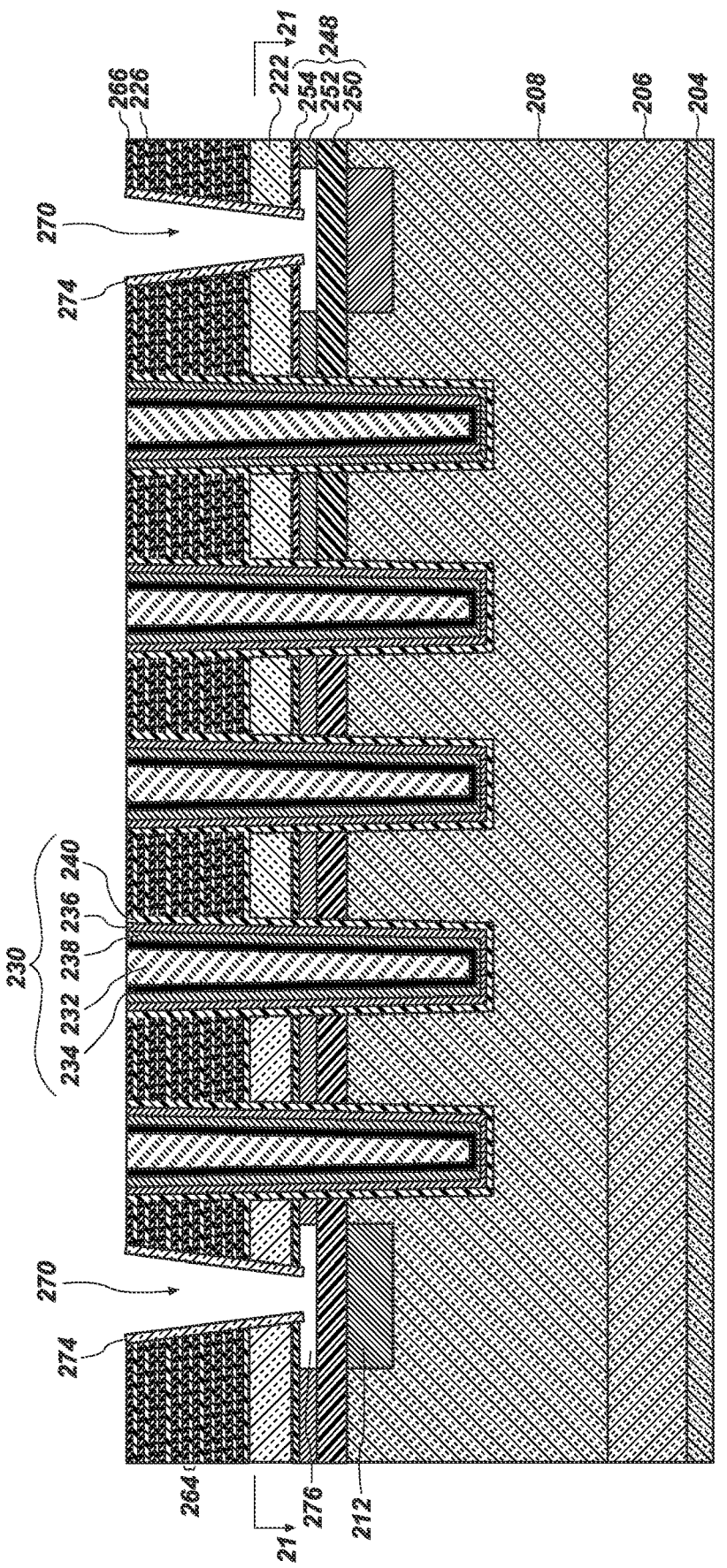
Figure 21:
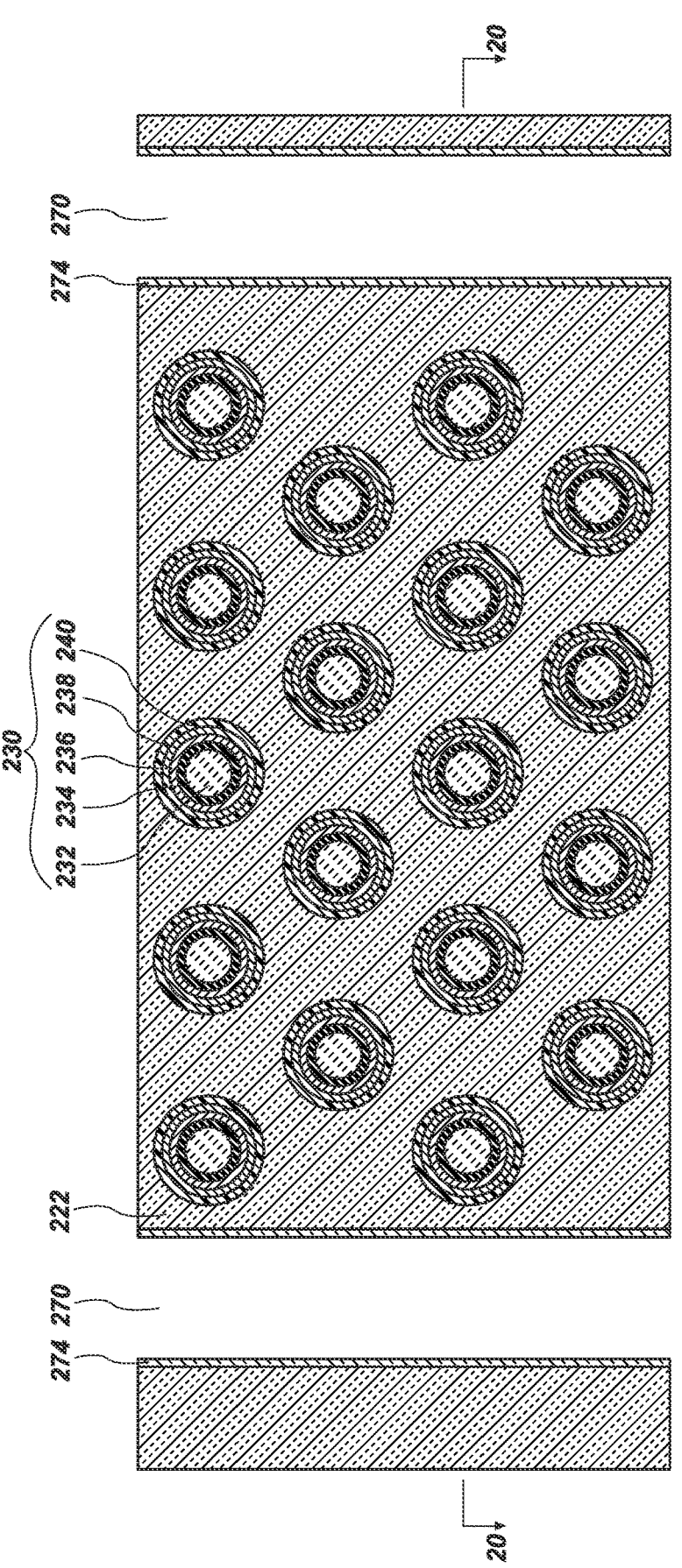

FIG. 20 is a cross-sectional schematic illustration taken through the line 20-20 in FIG. 21, and FIG. 21 is a cross-sectional schematic illustration taken through the line 21-21 in FIG. 20. A portion of the tiers 264, a portion of the second doped semiconductive material 222, a portion of the third sacrificial material 254, and the plug 214 are removed, as shown in FIGS. 20 and 21, to form a slit 270 through the tiers 264, the third sacrificial material 254 and to a slit liner opening 276 in the second sacrificial material 252 of the source contact sacrificial structure 248. The tiers 264, the third sacrificial material 254, and the plug 214 may be removed by one or more etch processes, such as by using conventional etch conditions. If a single etch process is conducted, the tiers 264, the third sacrificial material 254, and the plug 214 may be substantially removed by the single etch process. If more than one etch process is conducted, the etch stop material of the plug 214 may function as an etch stop during the first etch process to form the slit 270 and a second etch process may be conducted to remove the plug 214. For convenience, the slit 270 and the slit liner opening 276 are collectively referred to hereinafter as the slit 270. The slit 270 is formed vertically above the source implant region 212. The vertically lowermost portion (e.g., the bottom) of the slit 270 is formed with a lateral width that is less than the lateral width of the source implant region 212. While FIG. 14 illustrates the slit 270 as extending through the tiers 264 and the second doped semiconductive material 222 to an upper surface of the third sacrificial material 254, the slit 270 may extend partially into the third sacrificial material 254.

As shown in FIGS. 20 and 21, a slit liner 274 is formed on exposed surfaces in the slit 270 of the tiers 264, the second doped semiconductive material 222, and into the slit liner opening 276. The slit liner 274 may be conformally formed by conventional techniques such that a portion of the slit 270 remains open (e.g., unoccupied). The slit liner 274 may be formed of and include a dielectric material, a semiconductive material, or a conductive material. In some embodiments, the slit liner 274 is undoped polysilicon. The slit liner 274 may be formed to a thickness of from about 200 Å to about 400 Å.

To provide access to the pillars 230, the source contact sacrificial structure 248 and portions of the cell films (charge blocking material 240, charge trap material 238, tunnel dielectric material 236) are sequentially removed, as shown in FIGS. 22-26. The materials may be removed substantially similarly to the acts of the first embodiment describing FIGS. 6-10. The source contact sacrificial structure 248 is removed while a majority of the second doped semiconductive material 222 remains intact.

Figure 22:
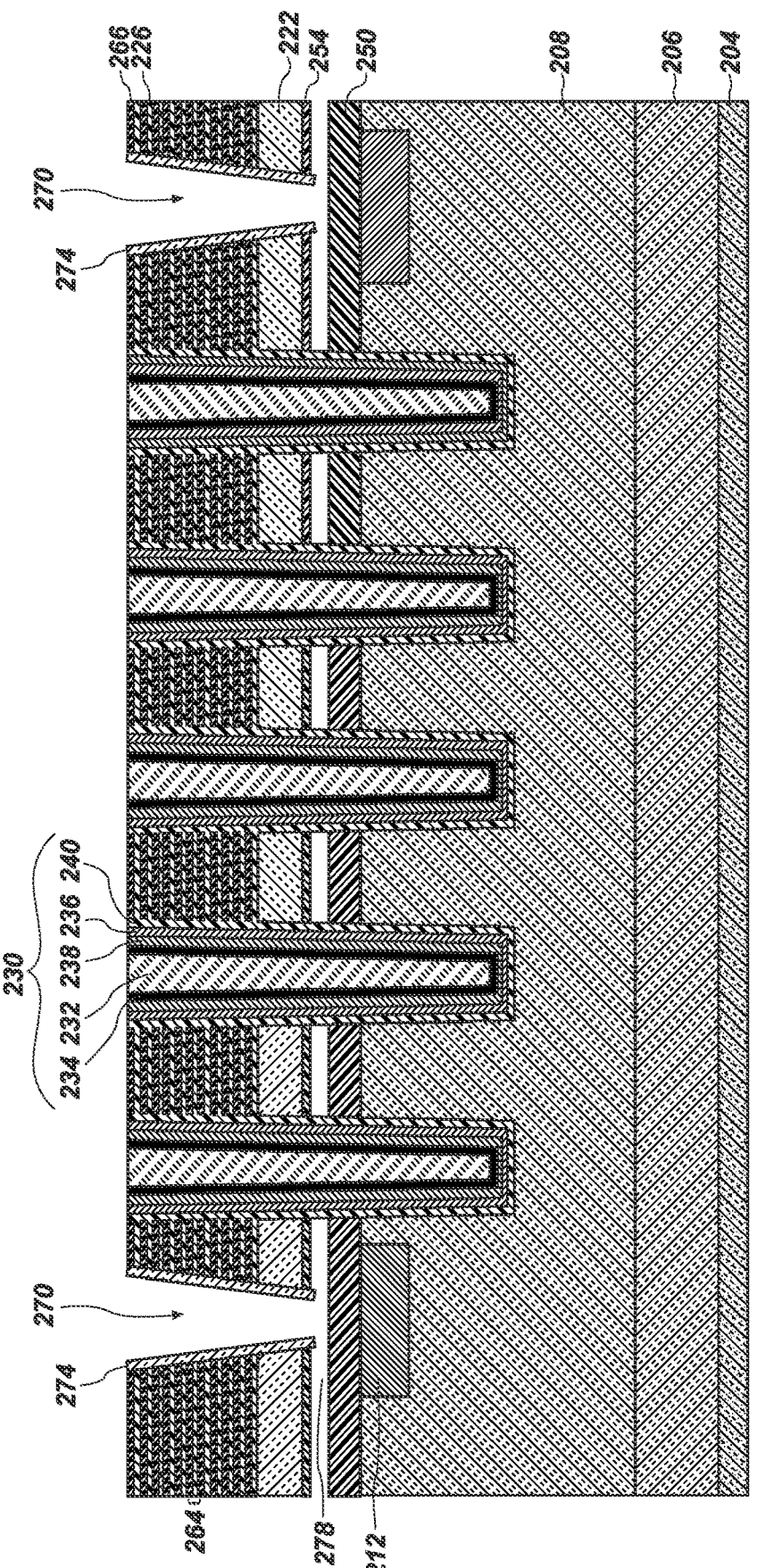
Figure 23:
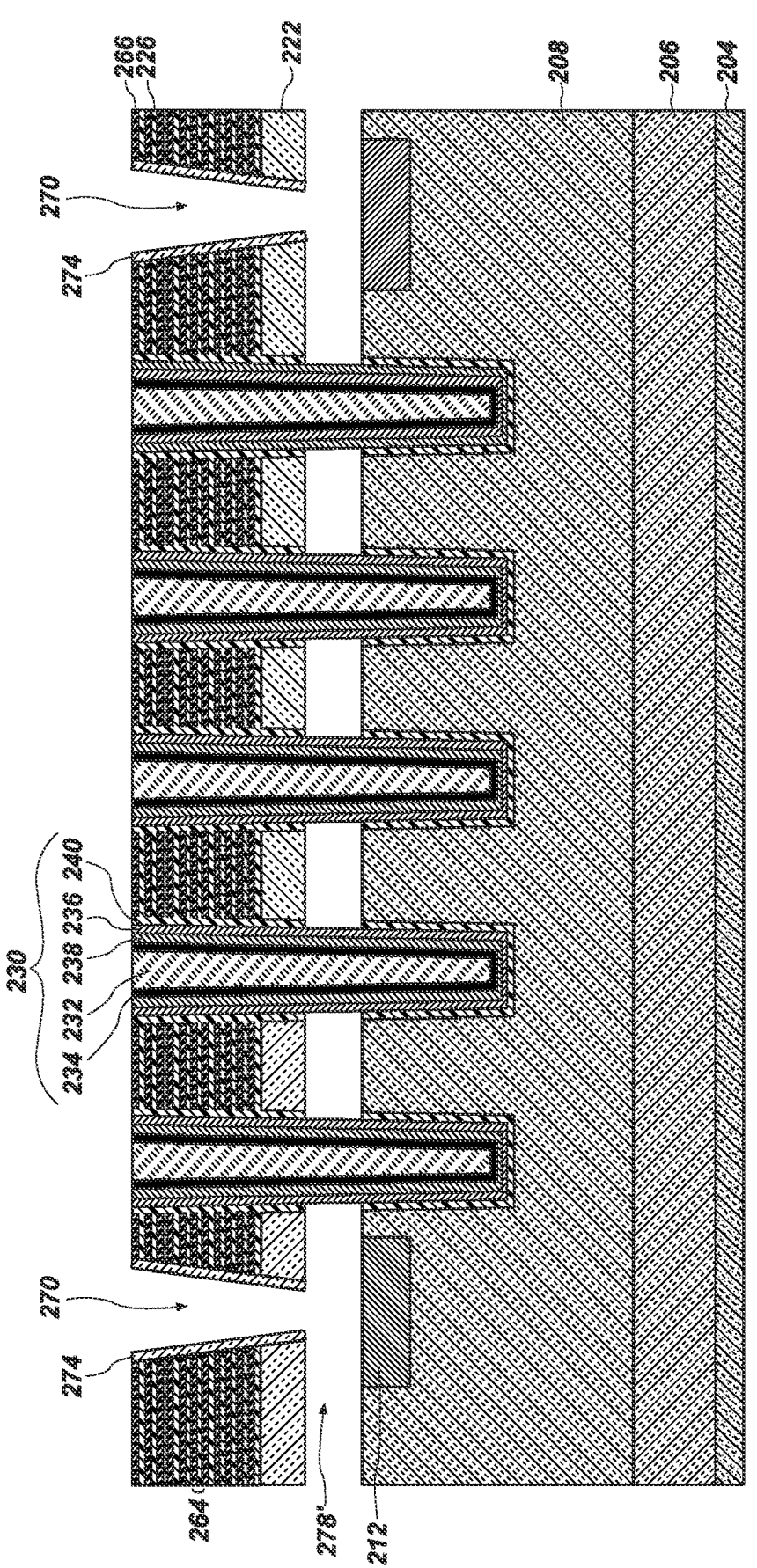
Figure 24:
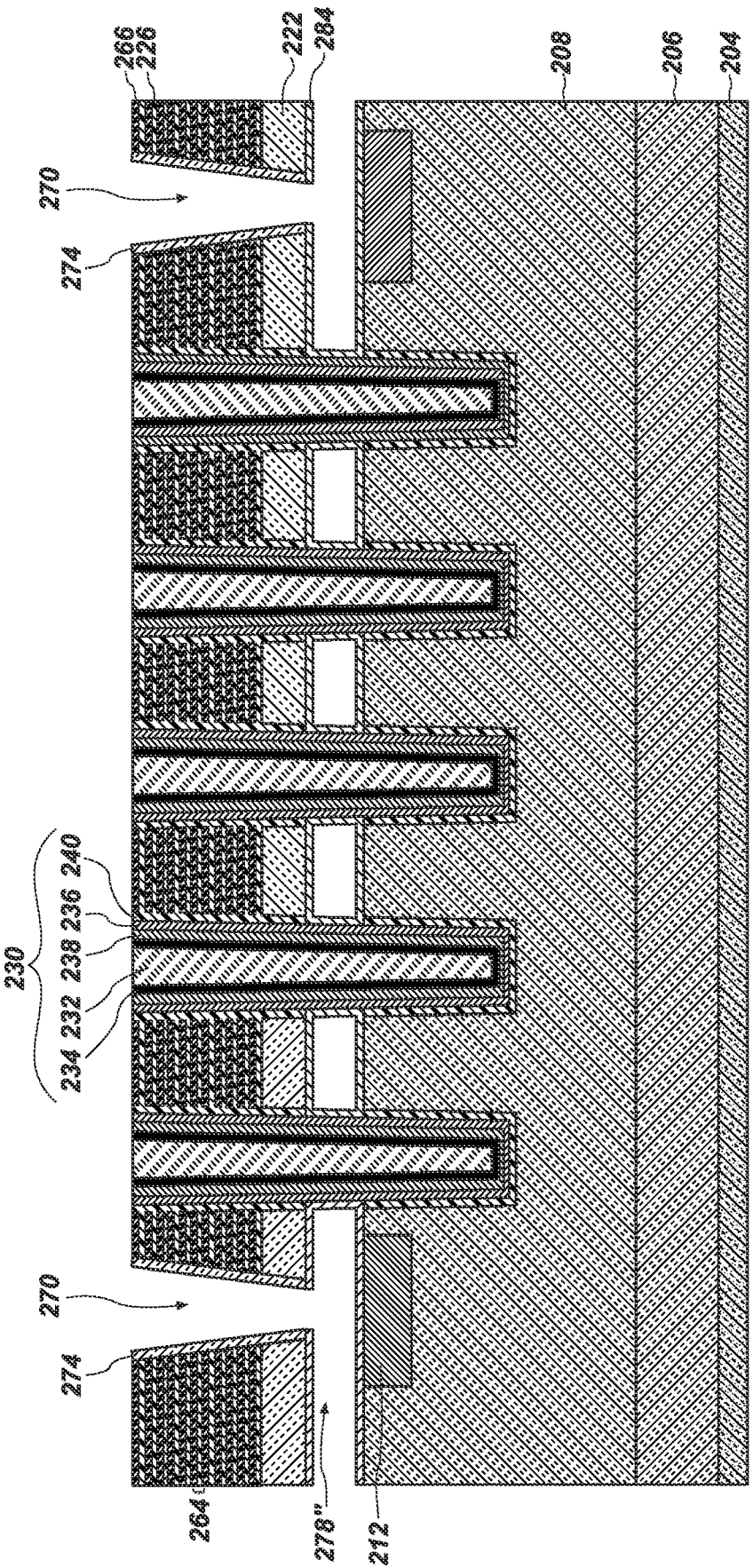
Figure 25:
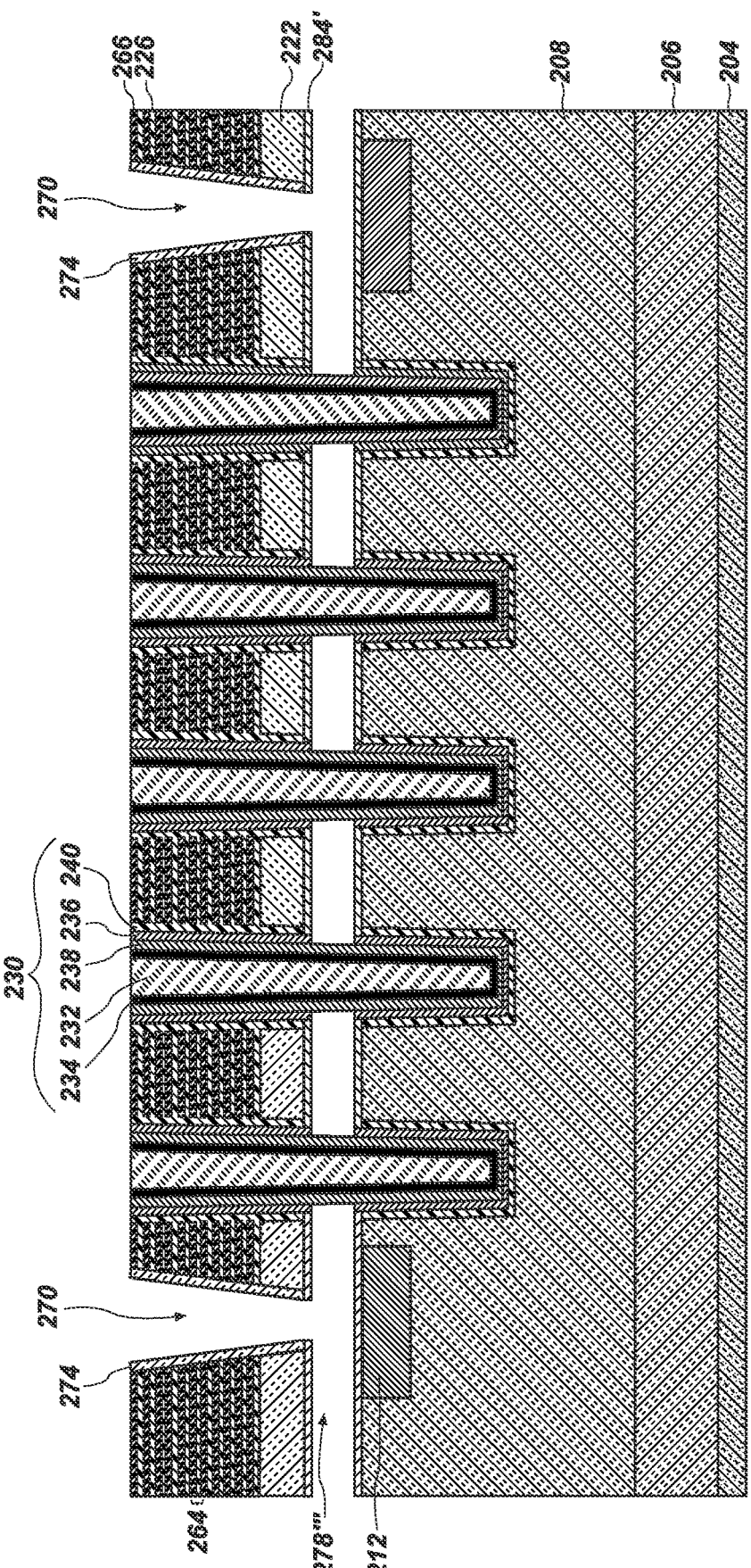
Figure 26:
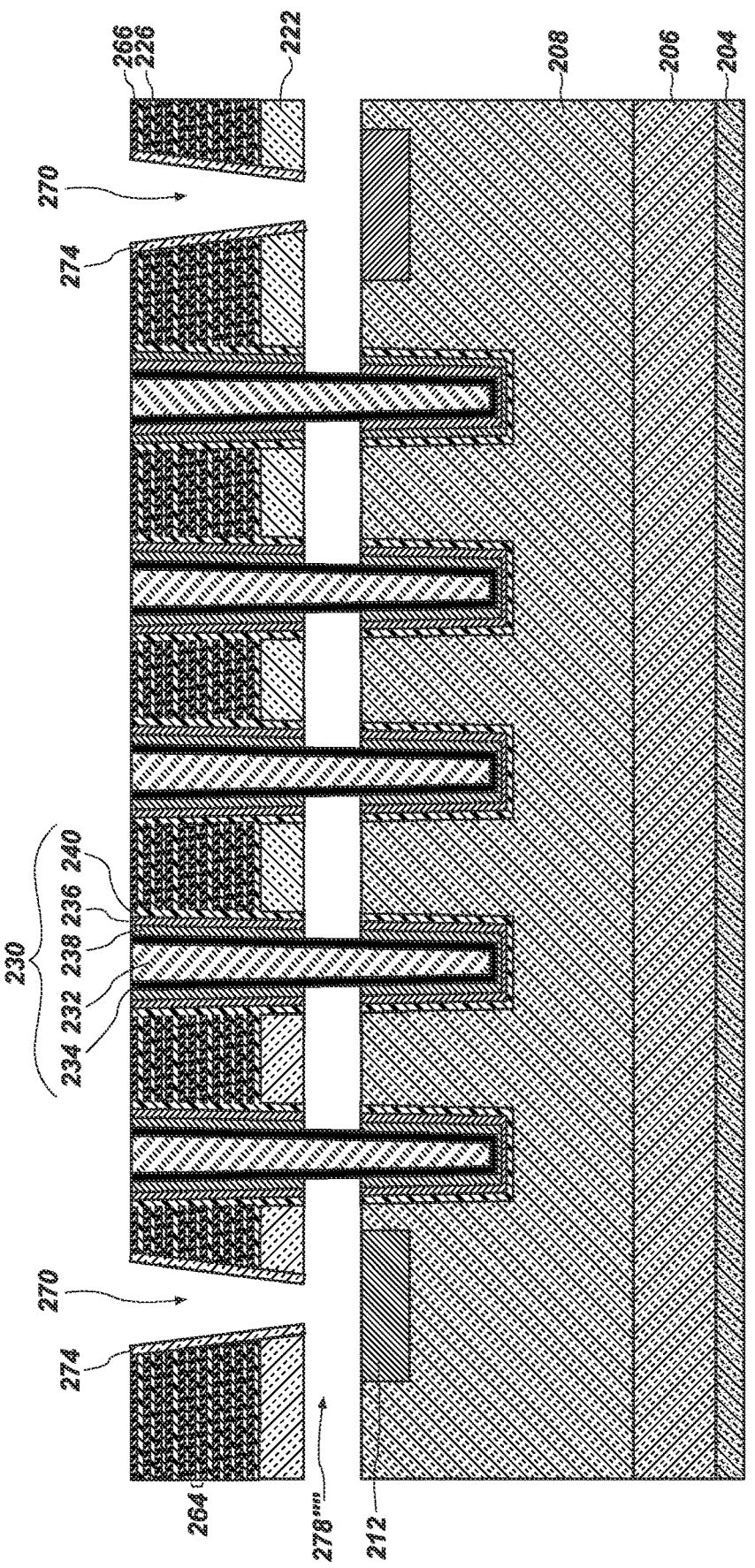
Figure 27:
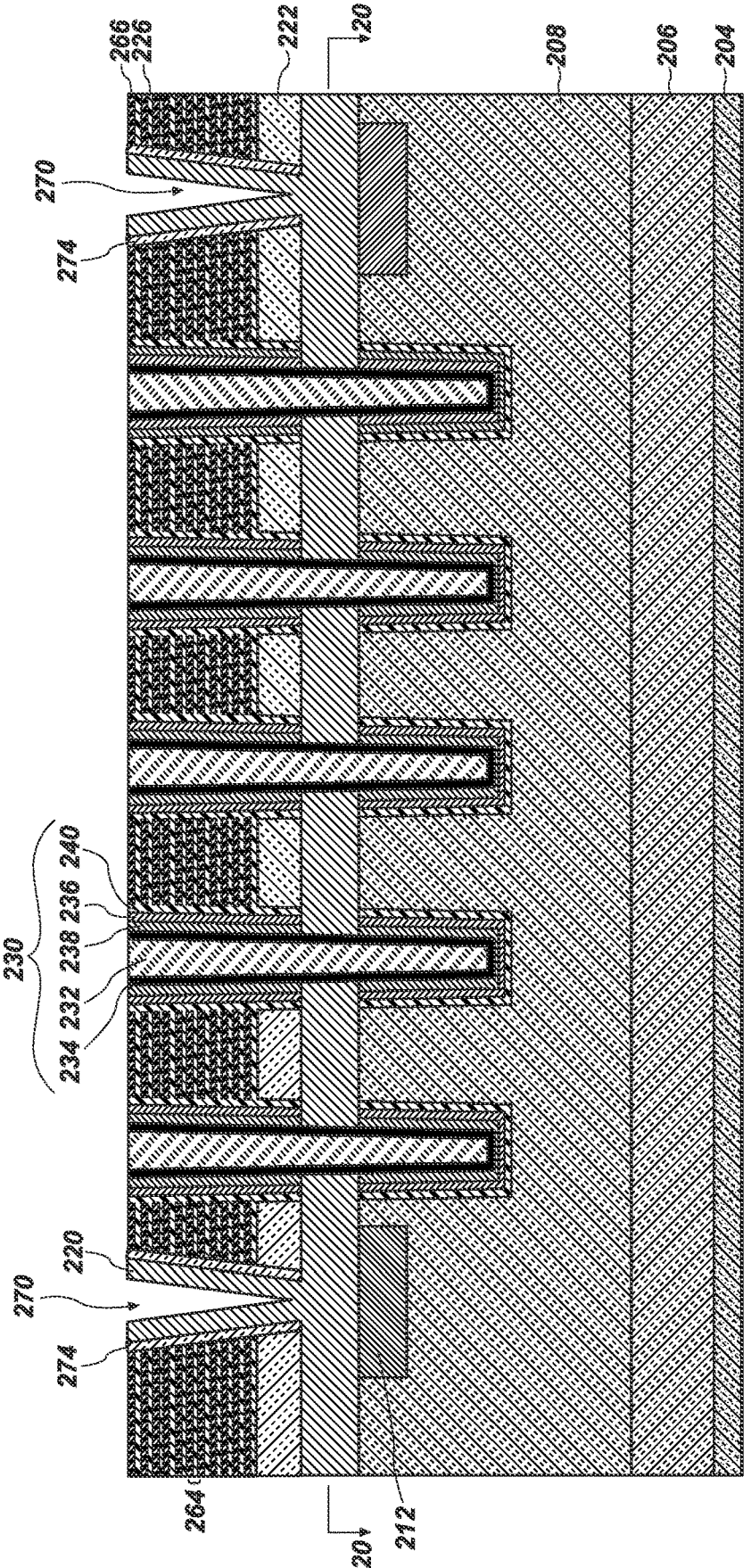
Figure 28:
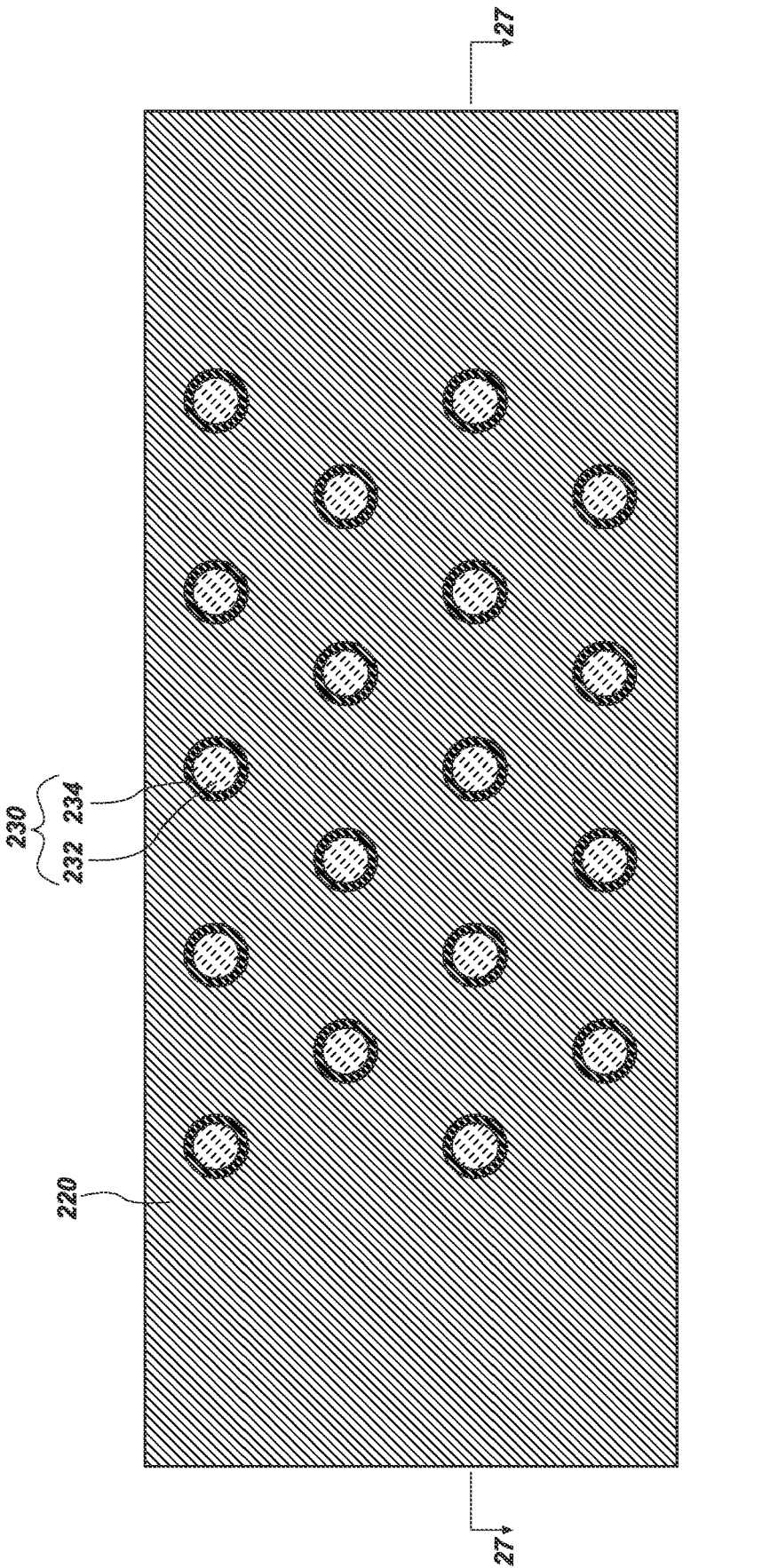
Figure 29:
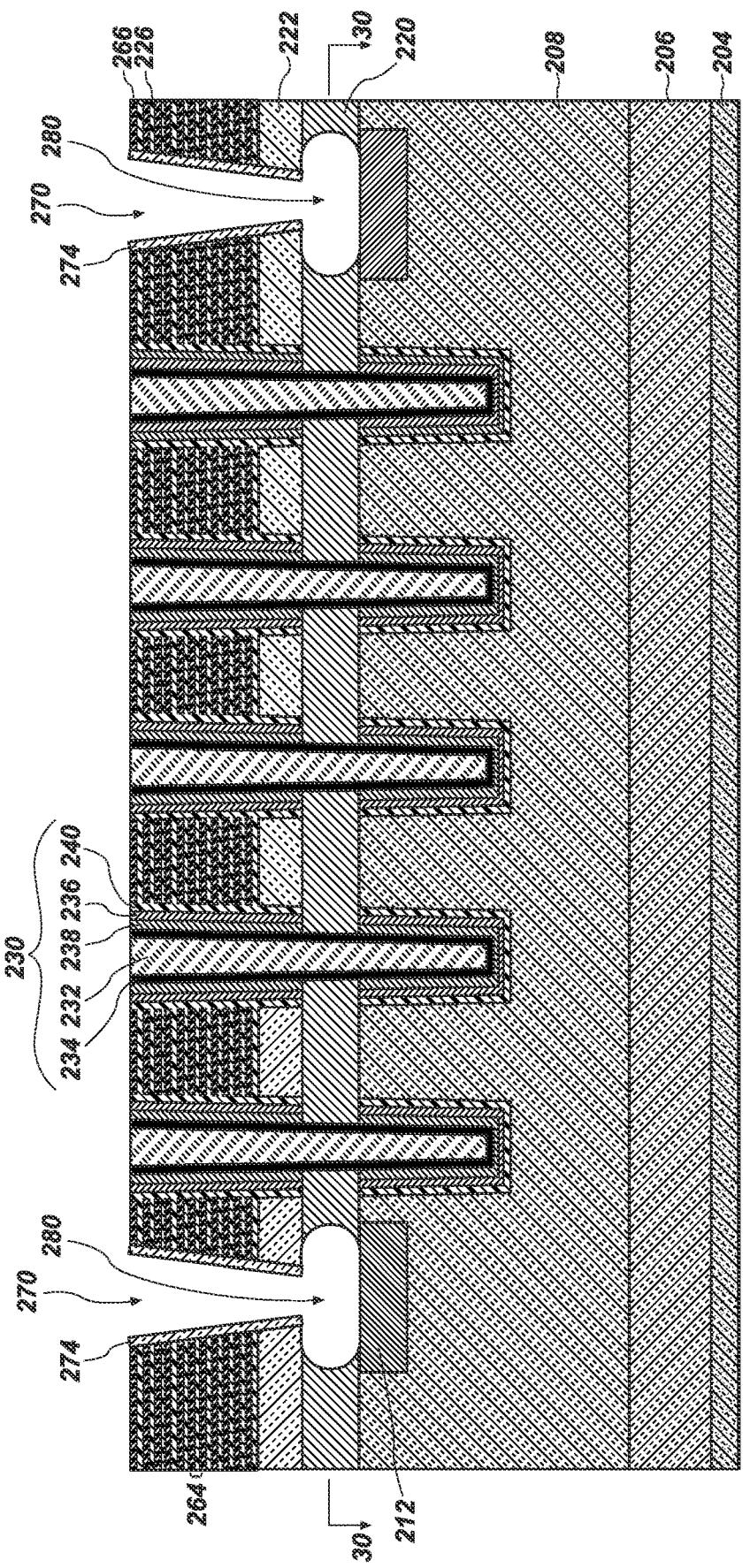
Figure 30:
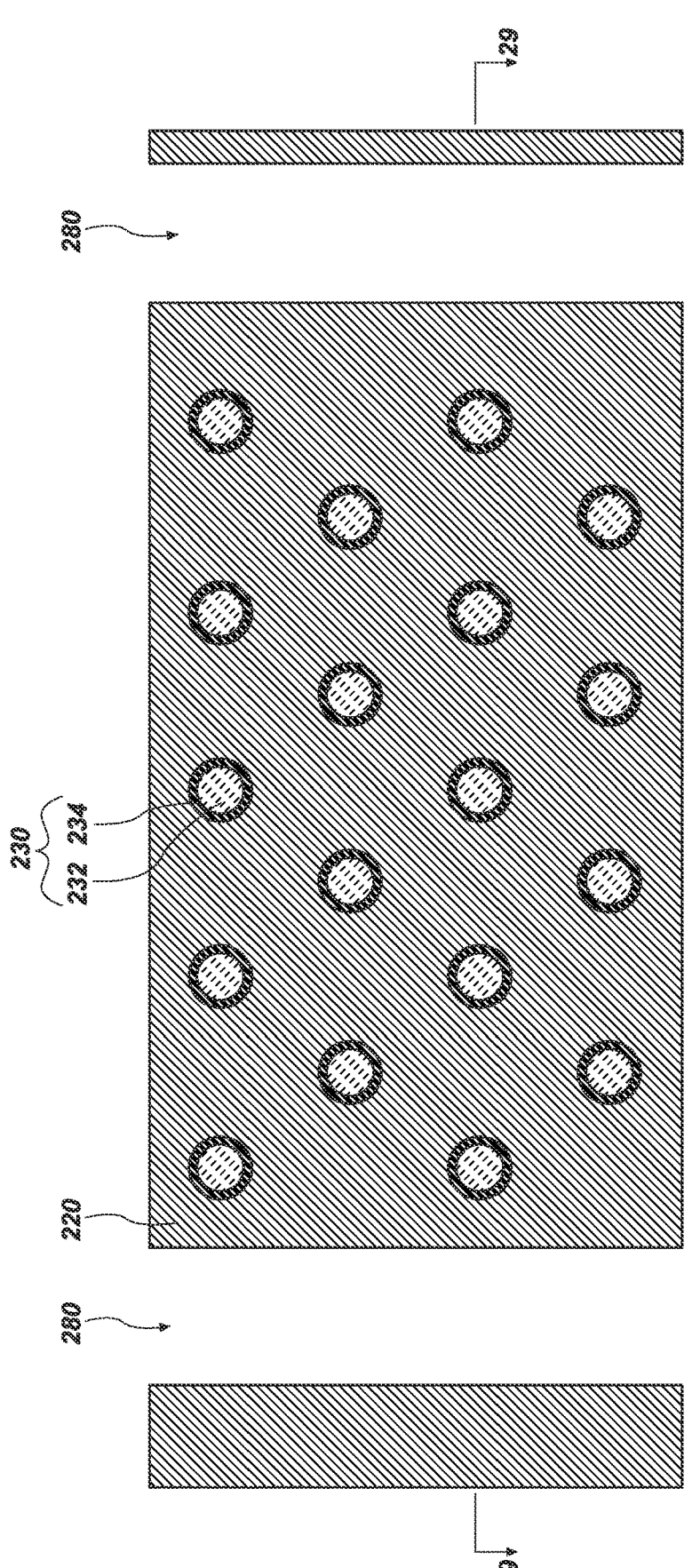
Figure 31:
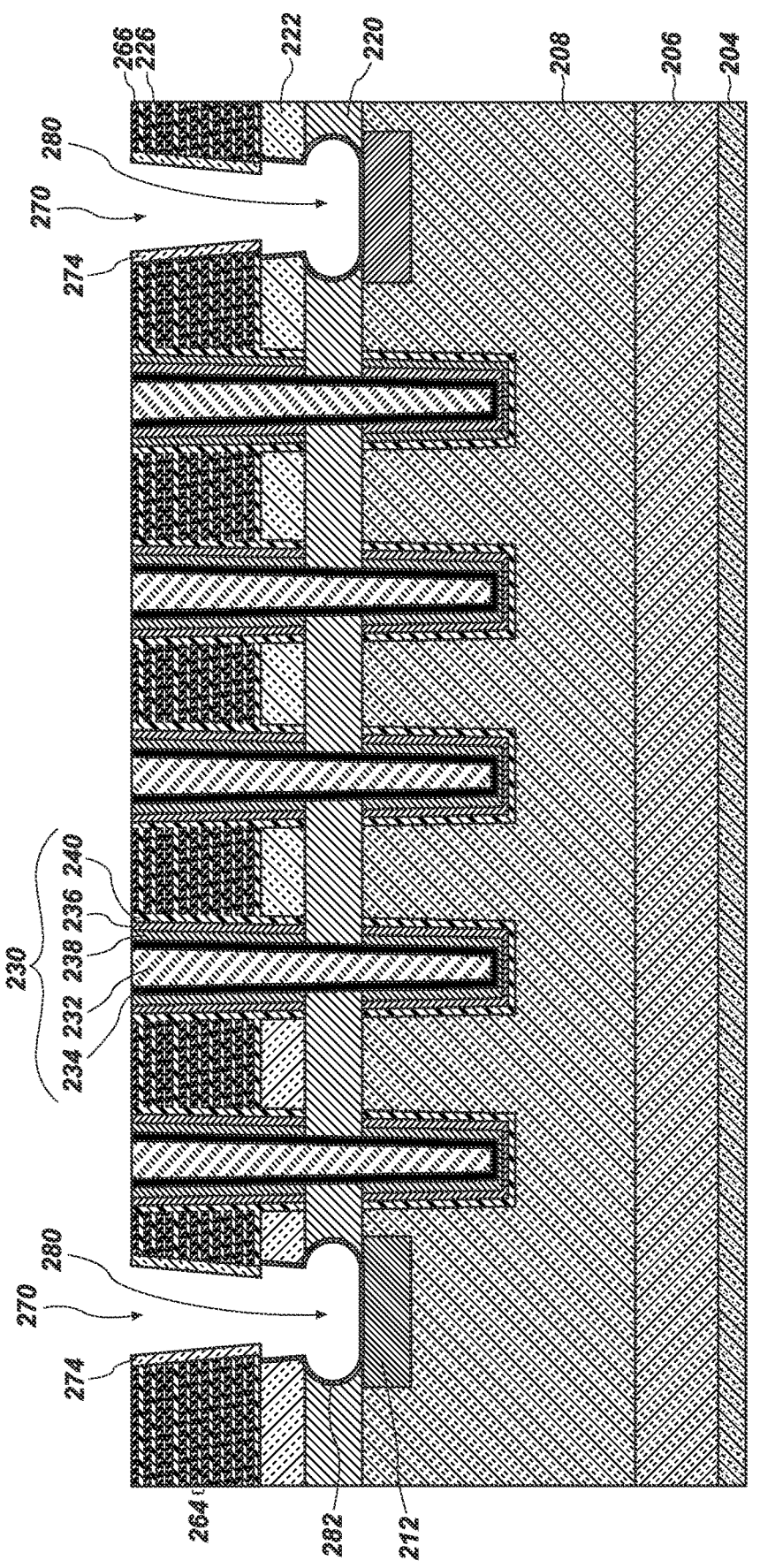

As shown in FIG. 22, the second sacrificial material 252 of the source contact sacrificial structure 248 is selectively removed without substantially removing the first and third sacrificial materials 250, 254 or the charge blocking material 240. This is followed by selective removal of an exposed portion of the charge blocking material 240, the first sacrificial material 250, and the third sacrificial material 254 without substantially removing the slit liner 274 as shown in FIG. 23. As shown in FIG. 24, a source contact opening liner 284 is introduced within the source contact opening 278′ forming the source contact opening 278″. The exposed vertical portion of the source contact opening liner 284 and the underlying charge trap material 238 is then selectively removed, as shown in FIG. 25, without substantially removing the slit liner 274 or the source contact opening liner from vertical surfaces. As shown in FIG. 26, the exposed portion of the tunnel dielectric material 236 is selectively removed, along with the remaining portion of the source contact opening liner 284′, increasing the size of the first source contact opening 278″ and forming first source contact opening 278‴. The exposed portion of the channel 234 may ultimately be in contact with the source contact 220 (see FIGS. 27-33).

Methods and features described in the formation of the source contact 220, source contact opening 280, and the source contact liner 282 as shown in FIGS. 27-31 are substantially similar to the methods and features described in the previous embodiment, shown in FIGS. 11-15.

Figure 32:
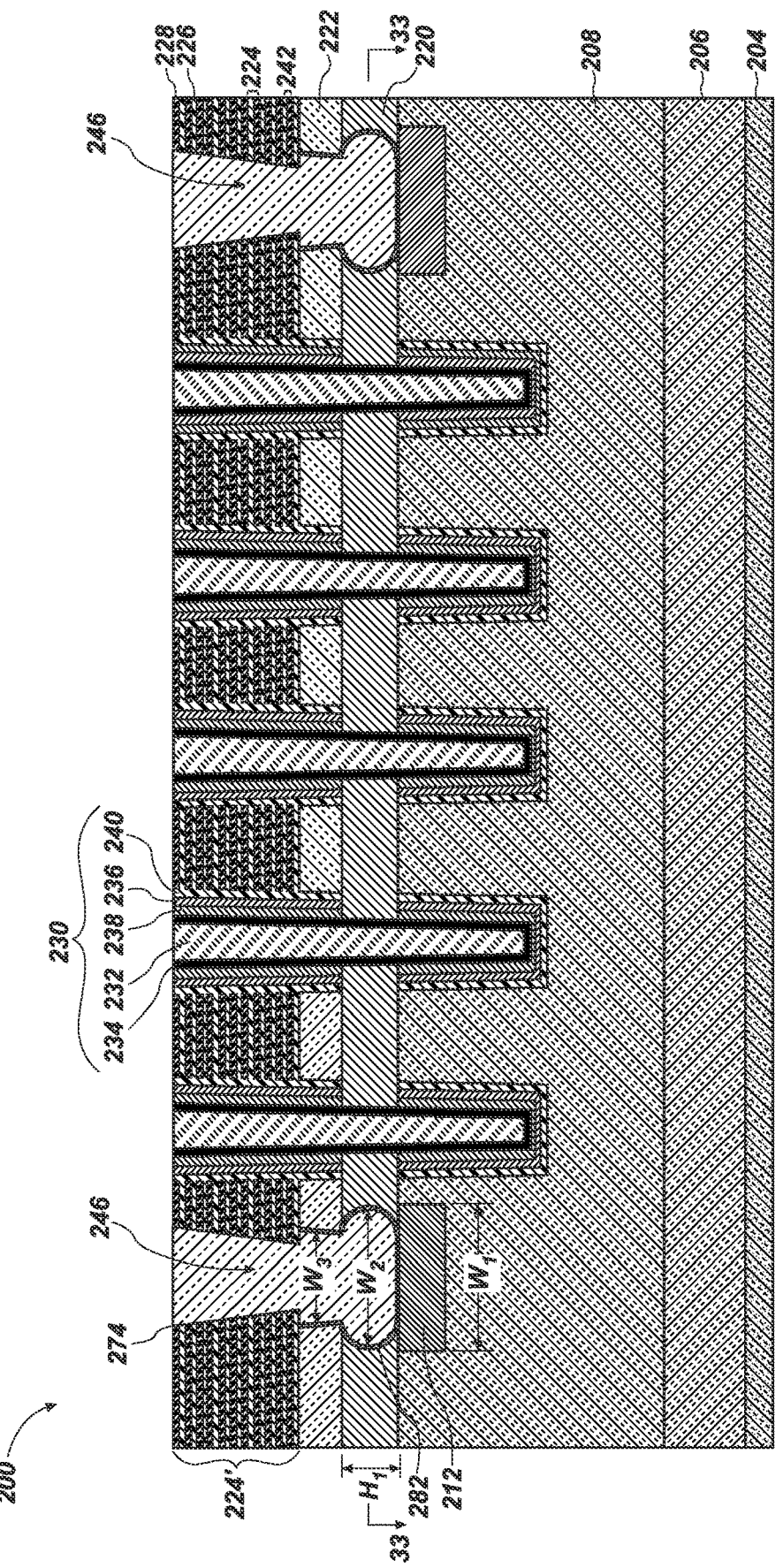
FIGS. 32 and 33 are cross-sectional, elevational, schematic illustrations of an electronic device in accordance with embodiments of the disclosure.
Figure 33:
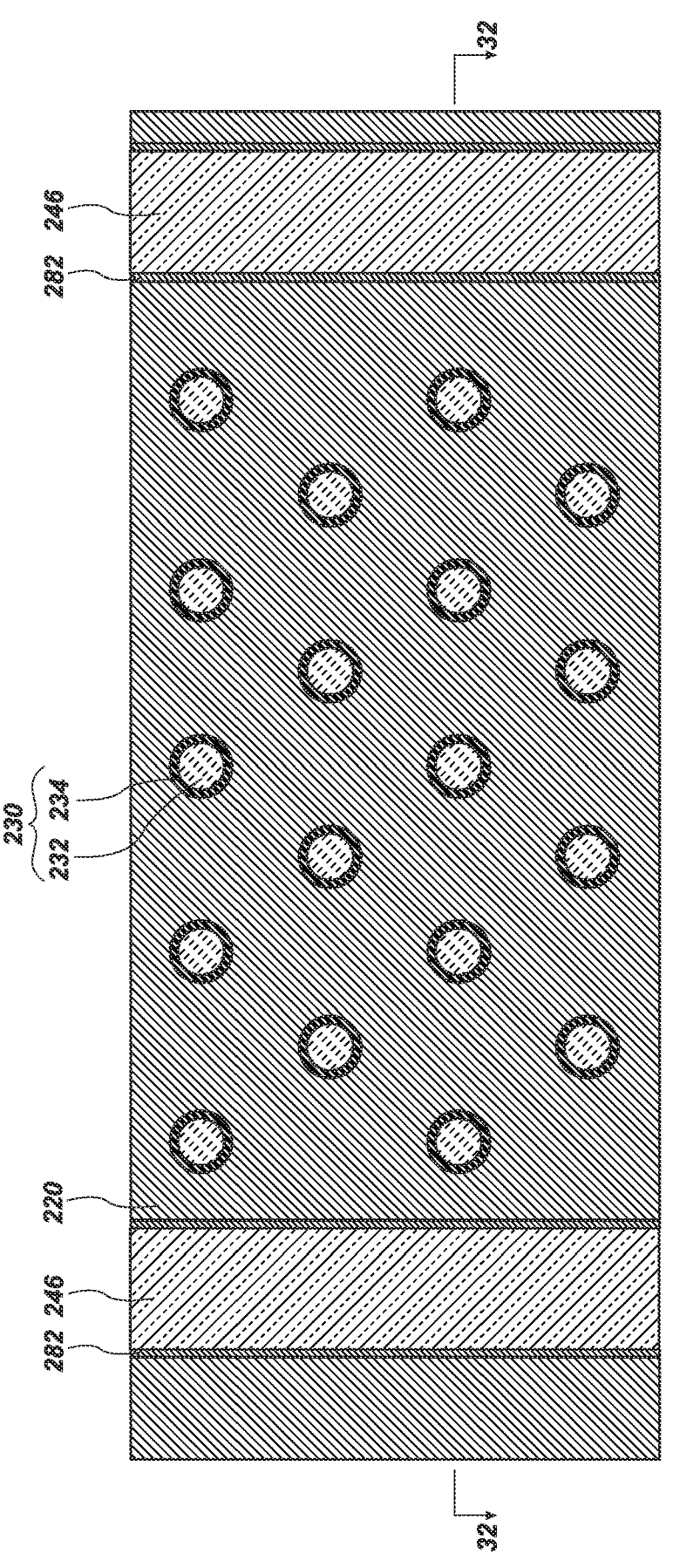

Subsequent process acts are then conducted to form the electronic device 200 as shown in FIGS. 32 and 33. These subsequent acts are substantially similar to those described in the previous embodiment to describe the electronic device 100, shown in FIGS. 16 and 17.

Accordingly, disclosed is an electronic device comprising a source stack comprising one or more conductive materials, a source contact adjacent to the source stack, and a doped semiconductive material adjacent to the source contact. A source implant region is within a top portion of the source stack. Tiers of alternating conductive materials and dielectric materials are adjacent to the doped semiconductive material and pillars extend through the tiers, the doped semiconductive material, and the source contact and into the source stack.

Accordingly, disclosed is an electronic device comprising a source stack comprising one or more conductive materials, with a source implant region in the source stack. A source contact is adjacent to the source stack, with sidewalls of the source contact vertically adjacent to the source implant region, and a doped semiconductive material is adjacent to the source contact. Tiers of alternating conductive materials and dielectric materials are adjacent to the doped semiconductive material, and pillars extend through the tiers and into the source stack. A fill material is laterally adjacent to the pillars and extends through the tiers and into the source contact. The fill material laterally adjacent to the source contact exhibits a smaller width in a lateral direction than a width of the source implant region in the lateral direction.

Accordingly, disclosed is a method of forming an electronic device that comprises forming a source implant region within a doped semiconductor material of a source stack. A source contact sacrificial structure is formed adjacent to the source implant region, and a doped semiconductive material is formed adjacent to the source contact sacrificial structure. Tiers are formed adjacent to the doped semiconductive material, the tiers comprising alternating dielectric materials and nitride materials. Pillars are formed through the tiers, the doped semiconductive material and into the source stack, the pillars including a channel, a charge blocking material, and a charge trap material. A slit is formed through the tiers to expose the source contact sacrificial structure, and a portion of the source contact sacrificial structure is removed to form a source contact opening. The source contact opening defined by sidewalls of the source contact and the sidewalls comprise a non-linear profile. A source contact is formed in the source contact opening and the slit. A portion of the source contact opening is removed above the source implant region, and a liner is formed on sidewalls of the source contact and on sidewalls of the doped semiconductive material. The nitride materials in the tiers are replaced with conductive materials and a fill material is formed in the slit.

Figure 34:
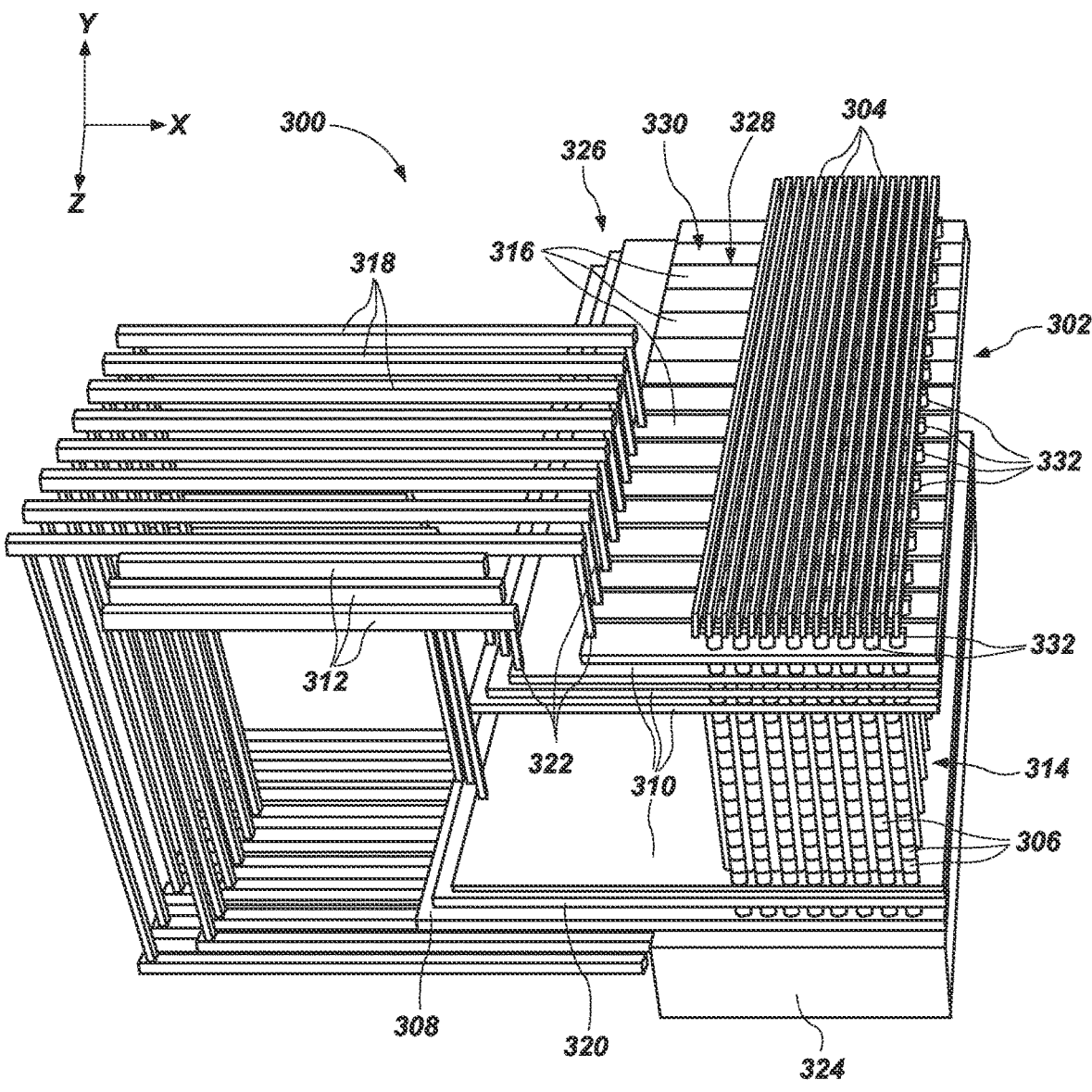
FIG. 34 is a partial, cutaway, perspective, schematic illustration of an apparatus including one or more electronic devices in accordance with embodiments of the disclosure.

With reference to FIG. 34 illustrated is a partial cutaway, perspective, schematic illustration of a portion of an apparatus 300 (e.g., a memory device) including an electronic device 302 according to embodiments of the disclosure. The electronic device 302 may be substantially similar to the embodiments of the electronic device described above (e.g., the electronic device 100, 200 of FIGS. 16 and 32) and may have been formed by the methods described above. By way of example only, the memory device may be a 3D NAND Flash memory device, such as a multideck 3D NAND Flash memory device. As illustrated in FIG. 34, the electronic device 302 may include a staircase structure 326 defining contact regions for connecting access lines (e.g., word lines) 312 to conductive tiers 310 (e.g., conductive regions, conductive materials of tiers). The electronic device 302 may include pillars 130, 230 (see FIGS. 16 and 32) with strings 314 (e.g., strings of memory cells) that are coupled to each other in series. The pillars 130, 230 with the strings 314 may extend at least somewhat vertically (e.g., in the Z-direction) and orthogonally relative to the conductive tiers 310, relative to data lines 304, relative to a source tier 308 (e.g., within one or more base materials under the source stack 102 (see FIG. 16)), relative to the access lines 312, relative to first select gates 316 (e.g., upper select gates, drain select gates (SGDs)), relative to select lines 318, and/or relative to second select gates 320 (e.g., SGS 142). The first select gates 316 may be horizontally divided (e.g., in the X-direction) into multiple blocks 330 by slits 328.

Vertical conductive contacts 322 may electrically couple components to each other, as illustrated. For example, the select lines 318 may be electrically coupled to the first select gates 316, and the access lines 312 may be electrically coupled to the conductive tiers 310. The apparatus 300 may also include a control unit 324 positioned under the memory array, which may include at least one of string driver circuitry, pass gates, circuitry for selecting gates, circuitry for selecting conductive lines (e.g., the data lines 304, the access lines 312), circuitry for amplifying signals, and circuitry for sensing signals. The control unit 324 may be electrically coupled to the data lines 304, the source tier 308, the access lines 312, the first select gates 316, and/or the second select gates 320, for example. In some embodiments, the control unit 324 includes CMOS (complementary metal-oxide-semiconductor) circuitry. In such embodiments, the control unit 324 may be characterized as having a so-called "CMOS under Array" (CuA) configuration.

The first select gates 316 may extend horizontally in a first direction (e.g., the Y-direction) and may be coupled to respective first groups of strings 314 of memory cells 306 at a first end (e.g., an upper end) of the strings 314. The second select gate 320 may be formed in a substantially planar configuration and may be coupled to the strings 314 at a second, opposite end (e.g., a lower end) of the strings 314 of memory cells 306.

The data lines 304 (e.g., bit lines) may extend horizontally in a second direction (e.g., in the X-direction) that is at an angle (e.g., perpendicular) to the first direction in which the first select gates 316 extend. The data lines 304 may be coupled to respective second groups of the strings 314 at the first end (e.g., the upper end) of the strings 314. A first group of strings 314 coupled to a respective first select gate 316 may share a particular string 314 with a second group of strings 314 coupled to a respective data line 304. Thus, a particular string 314 may be selected at an intersection of a particular first select gate 316 and a particular data line 304. Accordingly, the first select gates 316 may be used for selecting memory cells 306 of the strings 314 of memory cells 306.

The conductive tiers 310 (e.g., word lines, conductive liner materials 104 (e.g., FIG. 16)) may extend in respective horizontal planes. The conductive tiers 310 may be stacked vertically, such that each conductive tier 310 is coupled to all of the strings 314 of memory cells 306, and the strings 314 of the memory cells 306 extend vertically through the stack of conductive tiers 310. The conductive tiers 310 may be coupled to or may function as control gates of the memory cells 306 to which the conductive tiers 310 are coupled. Each conductive tier 310 may be coupled to one memory cell 306 of a particular string 314 of memory cells 306. The first select gates 316 and the second select gates 320 may operate to select a particular string 314 of the memory cells 306 between a particular data line 304 and the source tier 308. Thus, a particular memory cell 306 may be selected and electrically coupled to a data line 304 by operation of (e.g., by selecting) the appropriate first select gate 316, second select gate 320, and conductive tier 310 that are coupled to the particular memory cell 306.

The staircase structure 326 may be configured to provide electrical connection between the access lines 312 and the conductive materials of the tiers 310 through the vertical conductive contacts 322. In other words, a particular level of the conductive tiers 310 may be selected via one of the access lines 312 that is in electrical communication with a respective one of the vertical conductive contacts 322 in electrical communication with the particular conductive tier 310. The data lines 304 may be electrically coupled to the strings 314 through conductive structures 332 (e.g., conductive contacts).

Figure 35:
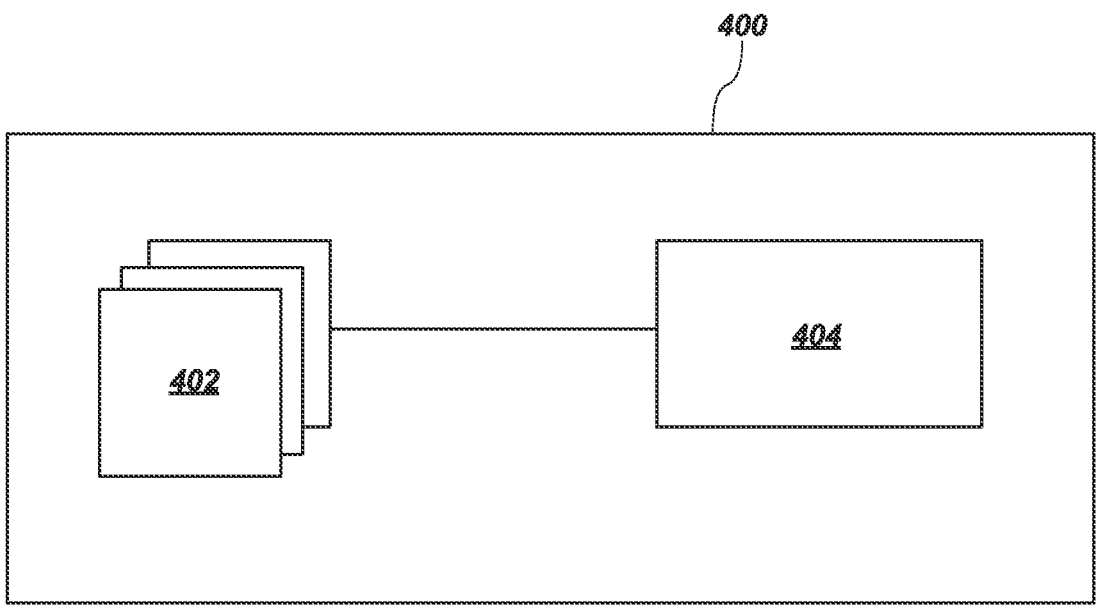
FIG. 35 is a block diagram of an electronic system including one or more electronic devices in accordance with embodiments of the disclosure.

The apparatus 300 including the electronic devices 100, 200 may be used in embodiments of electronic systems of the disclosure. FIG. 35 is a block diagram of an electronic system 400, in accordance with embodiments of the disclosure. The electronic system 400 includes, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc. The electronic system 400 includes at least one memory device 402 that includes, for example, one or more electronic devices 100. The electronic system 400 may further include at least one electronic signal processor device 404 (e.g., a microprocessor). The electronic signal processor device 404 may, optionally, include one or more electronic devices 100, 200.

Figure 36:
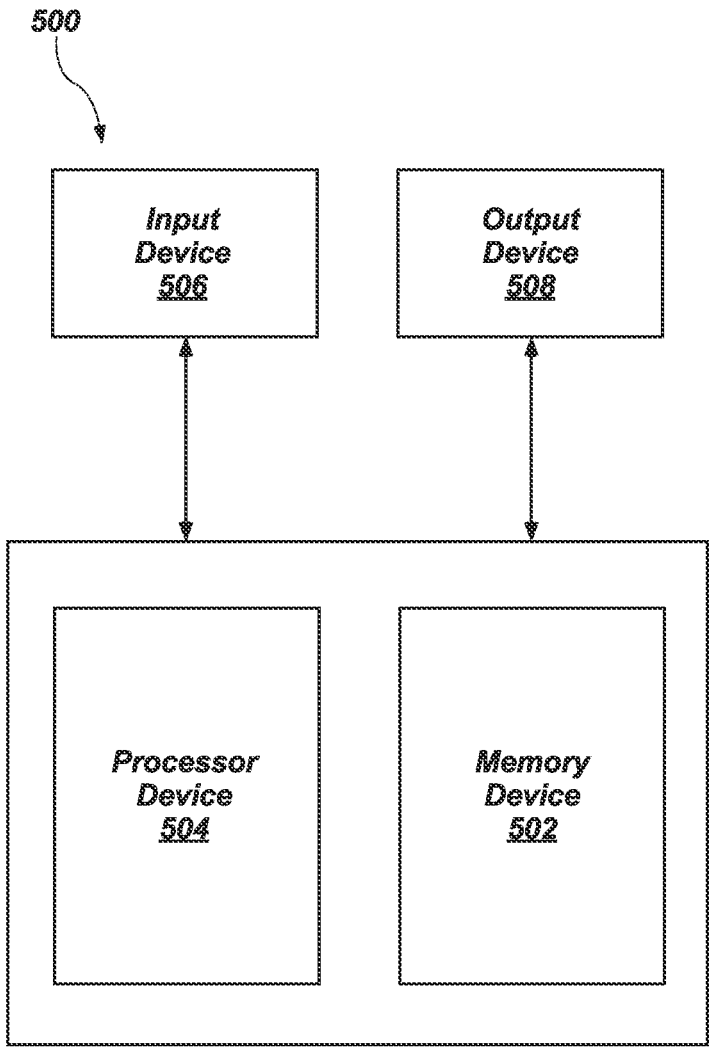
FIG. 36 is a block diagram of a processor-based system including one or more electronic devices in accordance with embodiments of the disclosure.

A processor-based system 500 (e.g., an electronic processor-based system 500), shown in FIG. 36, includes one or more input devices 506 for inputting information into the processor-based system 500 by a user, such as, for example, a mouse or other pointing device, a keyboard, a touchpad, a button, or a control panel. The processor-based system 500 may further include one or more output devices 508 for outputting information (e.g., visual or audio output) to a user such as, for example, a monitor, a display, a printer, an audio output jack, a speaker, etc. In some embodiments, the input device 506 and the output device 508 may comprise a single touchscreen device that can be used both to input information into the processor-based system 500 and to output visual information to a user. The input device 506 and the output device 508 may communicate electrically with one or more of the memory device 502 and the electronic signal processor device 504. The memory device 502 and the electronic signal processor device 504 may include one or more of the electronic devices 100.

Figure 37:
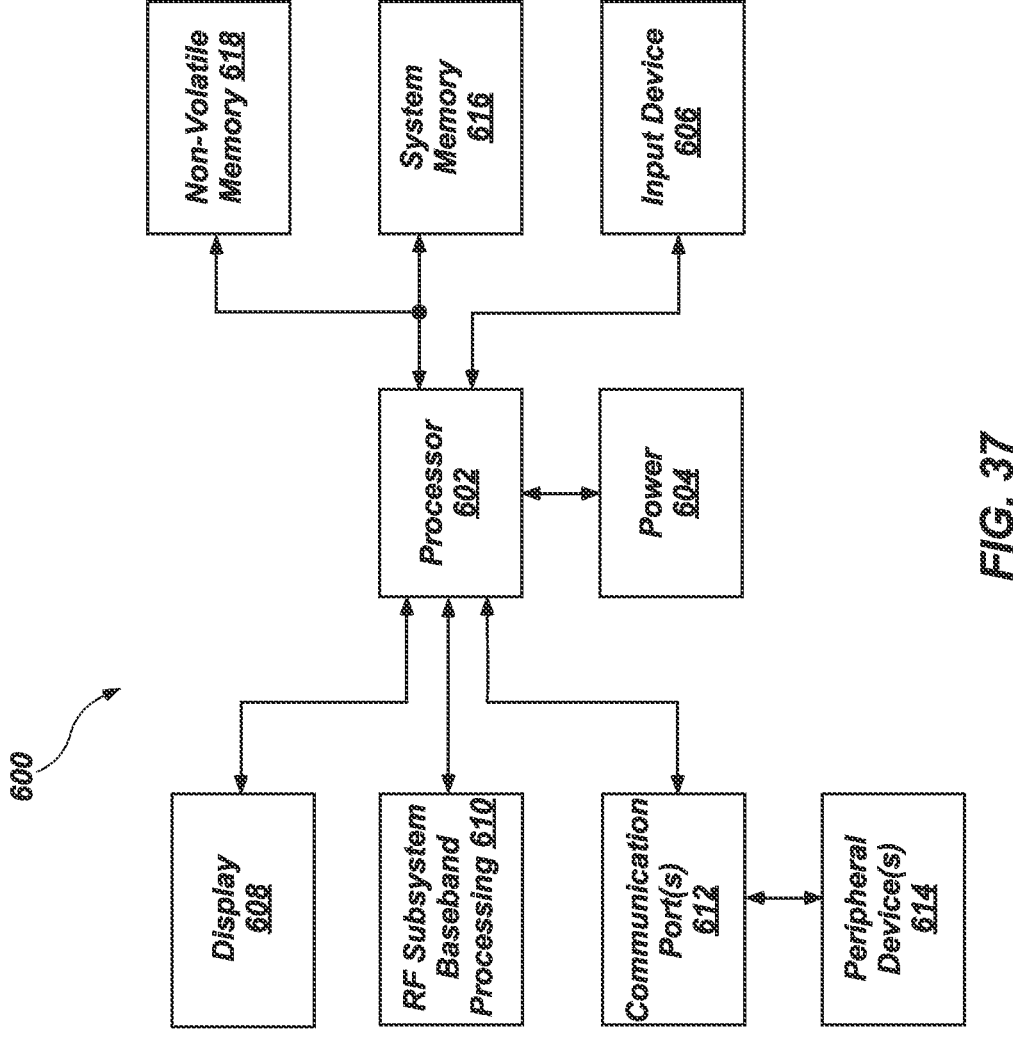
FIG. 37 is a block diagram of an additional processor-based system including one or more electronic devices in accordance with embodiments of the disclosure.

With reference to FIG. 37, shown is a block diagram of an additional processor-based system 600 (e.g., an electronic processor-based system 600). The processor-based system 600 may include various electronic devices 100 and apparatus 300 manufactured in accordance with embodiments of the disclosure. The processor-based system 600 may be any of a variety of types, such as a computer, a pager, a cellular phone, a personal organizer, a control circuit, or another electronic device. The processor-based system 600 may include one or more processors 602, such as a microprocessor, to control the processing of system functions and requests in the processor-based system 600. The processor 602 and other subcomponents of the processor-based system 600 may include electronic devices 100 and apparatus 300 manufactured in accordance with embodiments of the disclosure.

The processor-based system 600 may include a power supply 604 in operable communication with the processor 602. For example, if the processor-based system 600 is a portable system, the power supply 604 may include one or more of a fuel cell, a power scavenging device, permanent batteries, replaceable batteries, and/or rechargeable batteries. The power supply 604 may also include an AC adapter if, for example, the processor-based system 600 may be plugged into a wall outlet. The power supply 604 may also include a DC adapter such that the processor-based system 600 may be plugged into a vehicle cigarette lighter or a vehicle power port, for example.

Various other devices may be coupled to the processor 602 depending on the functions that the processor-based system 600 performs. For example, a user interface may be coupled to the processor 602. The user interface may include one or more input devices 606, such as buttons, switches, a keyboard, a light pen, a mouse, a digitizer and stylus, a touch screen, a voice recognition system, a microphone, or a combination thereof. A display 608 may also be coupled to the processor 602. The display 608 may include an LCD display, an SED display, a CRT display, a DLP display, a plasma display, an OLED display, an LED display, a three-dimensional projection, an audio display, or a combination thereof. Furthermore, an RF subsystem/baseband processor 610 may also be coupled to the processor 602. The RF subsystem/baseband processor 610 may include an antenna that is coupled to an RF receiver and to an RF transmitter. A communication port 612, or more than one communication port 612, may also be coupled to the processor 602. The communication port 612 may be adapted to be coupled to one or more peripheral devices 614 (e.g., a modem, a printer, a computer, a scanner, a camera) and/or to a network (e.g., a local area network (LAN), a remote area network, an intranet, or the Internet).

The processor 602 may control the processor-based system 600 by implementing software programs stored in the memory (e.g., system memory 616). The software programs may include an operating system, database software, drafting software, word processing software, media editing software, and/or media-playing software, for example. The memory is operably coupled to the processor 602 to store and facilitate execution of various programs. For example, the processor 602 may be coupled to system memory 616, which may include one or more of spin torque transfer magnetic random access memory (STT-MRAM), magnetic random access memory (MRAM), dynamic random access memory (DRAM), static random access memory (SRAM), racetrack memory, and/or other known memory types. The system memory 616 may include volatile memory, nonvolatile memory, or a combination thereof. The system memory 616 is typically large so it can store dynamically loaded applications and data. The system memory 616 may include one or more apparatus 300 and one or more electronic devices 100 according to embodiments of the disclosure.

The processor 602 may also be coupled to non-volatile memory 618, which is not to suggest that system memory 616 is necessarily volatile. The non-volatile memory 618 may include one or more of STT-MRAM, MRAM, read-only memory (ROM) (e.g., EPROM, resistive read-only memory (RROM)), and Flash memory to be used in conjunction with the system memory 616. The size of the non-volatile memory 618 is typically selected to be just large enough to store any necessary operating system, application programs, and fixed data. Additionally, the non-volatile memory 618 may include a high-capacity memory (e.g., disk drive memory, such as a hybrid-drive including resistive memory or other types of nonvolatile solid-state memory, for example). The non-volatile memory 618 may include one or more apparatus 300 and one or more electronic devices 100 according to embodiments of the disclosure.

Accordingly, disclosed is an electronic system comprising an input device, an output device, a processor device operably coupled to the input device and to the output device, and one or more memory devices operably coupled to the processor device. The one or more memory devices comprises a source contact adjacent to a source stack, a source implant region in the source stack, sidewalls of the source contact are above the source implant region, a semiconductive material adjacent to the source contact, tiers of alternating conductive materials and dielectric materials adjacent to the semiconductive material, and memory pillars extending through the tiers, the semiconductive material, the source contact, and partially into the source stack.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
a source stack comprising one or more conductive materials;
a source implant region within a top portion of the source stack;
a source contact adjacent to the source stack, sidewalls of the source contact vertically adjacent to the source implant region;
a doped semiconductive material adjacent to the source contact;
tiers of alternating conductive materials and dielectric materials adjacent to the doped semiconductive material;
pillars extending through the tiers of alternating conductive materials and dielectric materials, the doped semiconductive material and the source contact and into the source stack, the source implant region laterally adjacent to the pillars;
a fill material over the source implant region and extending through the tiers of alternating conductive materials and dielectric materials, through the doped semiconductive material, and into the source contact, wherein a width of the fill material laterally adjacent to a top of the doped semiconductive material is wider than a width of the fill material laterally adjacent to a bottom of the tiers of alternating conductive materials and dielectric materials; and
another doped semiconductive material extending between and separating the pillars and the source implant region.

2. The electronic device of claim 1, further comprising a source contact liner between the fill material and the source implant region.

3. The electronic device of claim 1, further comprising a source contact liner between the fill material and the source contact.

4. The electronic device of claim 1, wherein a source contact liner is laterally interposed between the fill material and the source contact and laterally interposed between the fill material and the doped semiconductive material.

5. The electronic device of claim 1, wherein a width of the source implant region is wider in a lateral direction than a width in the lateral direction of a portion of the fill material laterally adjacent to a bottom of the doped semiconductive material.

6. The electronic device of claim 1, wherein a top surface of the source implant region is coplanar with a top surface of the source stack.

7. The electronic device of claim 1, further comprising a source contact liner wherein a portion of the source contact liner is laterally adjacent to the fill material and the doped semiconductive material.

8. The electronic device of claim 1, wherein the fill material laterally adjacent to the source contact exhibits a greater width in a lateral direction than a width of the source implant region in the lateral direction.

9. The electronic device of claim 1, wherein the fill material laterally adjacent to the source contact exhibits substantially the same width in a lateral direction than as a width of the source implant region in the lateral direction.

10. The electronic device of claim 1, wherein the fill material laterally adjacent to the source contact exhibits a smaller width in a lateral direction than a width of the source implant region in the lateral direction.

11. The electronic device of claim 1, wherein the source contact is below the doped semiconductive material and extends laterally to a channel of the pillars.

12. The electronic device of claim 1, wherein the source implant region comprises a boron doped polysilicon material.

13. An electronic device, comprising:

a source stack comprising one or more conductive materials;

a source implant region in the source stack;

a source contact adjacent to the source stack;

a doped semiconductive material adjacent to the source contact;

tiers of alternating conductive materials and dielectric materials adjacent to the doped semiconductive material;

pillars extending through the tiers of alternating conductive materials and dielectric materials and into the source stack; and a fill material laterally adjacent to the pillars and extending through the tiers of alternating conductive materials and dielectric materials and into the source contact, the fill material laterally adjacent to the source contact exhibiting a smaller width in a lateral direction than a width of the source implant region in the lateral direction, and a lower surface of the fill material vertically adjacent to the source implant region.

14. The electronic device of claim 13, wherein the fill material is laterally adjacent to the doped semiconductive material and the fill material laterally adjacent to the doped semiconductive material exhibits a smaller width in a lateral direction than the fill material laterally adjacent to the source contact.

15. The electronic device of claim 13, wherein a lower portion of the fill material exhibits a greater width in the lateral direction than an upper portion of the fill material.

16. A method of forming an electronic device, the method comprising:

forming a source implant region within a first doped semiconductor material of a source stack, the source stack comprising one or more conductive materials;

forming a source contact sacrificial structure adjacent to the source implant region;

forming a second doped semiconductive material adjacent to the source contact sacrificial structure;

forming tiers adjacent to the second doped semiconductive material, the tiers comprising alternating dielectric materials and nitride materials;

forming pillars through the tiers, the second doped semiconductive material and into the source stack, the pillars including a channel, a charge blocking material, and a charge trap material, the source implant region laterally adjacent to the pillars and within a top portion of the source stack;

forming a slit through the tiers to expose the source contact sacrificial structure;

removing a portion of the source contact sacrificial structure to form a source contact opening, the source contact opening defined by sidewalls of the source contact sacrificial structure and the sidewalls comprising a non-linear profile;

forming a source contact in the source contact opening and the slit, the source contact adjacent to the source stack and the second doped semiconductive material adjacent to the source contact and sidewalls of the source contact vertically adjacent to the source implant region;

removing a portion of the source contact to form a source contact opening above the source implant region;

forming a liner on sidewalls of the source contact and on sidewalls of the second doped semiconductive material; and replacing the nitride materials in the tiers with conductive materials to form tiers of alternating conductive materials and dielectric materials adjacent to the second doped semiconductive material, the pillars extending through the tiers of alternating conductive materials and dielectric materials and into the source stack; and forming a fill material in the slit and over the source implant region, the fill material laterally adjacent to the pillars and extending through the tiers of alternating conductive materials and dielectric materials, the second doped semiconductive material, and into the source contact, wherein a width of the fill material laterally adjacent to a top of the doped semiconductive material is wider than a width of the fill material laterally adjacent to a bottom of the tiers of alternating conductive materials and dielectric materials.

17. The method of claim 16, wherein forming a slit through the tiers comprises forming the slit vertically adjacent to the source implant region.

18. The method of claim 16, wherein forming a slit through the tiers comprises forming the slit exhibiting a relative smaller width in a lateral direction than a width in the lateral direction of the source implant region.

19. The method of claim 16, further comprising forming a plug in the source contact opening above the source implant region.

20. The method of claim 19, wherein forming a plug in the source contact opening forming the plug exhibiting substantially the same width as a width of the source implant region.

21. The method of claim 16, further comprising forming a slit sacrificial structure in the second doped semiconductive material.

22. The method of claim 21, wherein forming a fill material in the slit comprises forming the fill material exhibiting a width laterally adjacent to a top of the second doped semiconductive material to be wider than the portion of the fill material laterally adjacent to a bottom of the tiers.

23. An electronic system, comprising:

an input device;

an output device;

a processor device operably coupled to the input device and to the output device; and one or more memory devices operably coupled to the processor device, the one or more memory devices comprising:

a source contact adjacent to a source stack;

a source implant region in the source stack, sidewalls of the source contact above the source implant region;

a semiconductive material vertically adjacent to the source contact, lower surfaces of the semiconductive material being coplanar;

tiers of alternating conductive materials and dielectric materials adjacent to the semiconductive material;

a fill material overlying the source implant region and extending through the source contact, the semiconductive material, and the tiers of alternating conductive materials and dielectric materials;

a liner interposed between the fill material and the semiconductive material, between the fill material and the source contact, and between the fill material and the source implant region; and memory pillars extending through the tiers of alternating conductive materials and dielectric materials, the semiconductive material, the source contact, and partially into the source stack.

24. The electronic system of claim 23, wherein the memory pillars comprise a channel extending continuously through the tiers of alternating conductive materials and dielectric materials, the semiconductive material, and the source contact, and a charge blocking material and a charge trap material extending through the tiers of alternating conductive materials and dielectric materials and the semiconductive material.

\* \* \* \* \*